United States Patent [19]

Saka et al.

[11] Patent Number: 5,483,686
[45] Date of Patent: Jan. 9, 1996

[54] CHANNEL SELECTING APPARATUS FOR SIMULTANEOUS USE WITH BOTH PHASE-CONTINUOUS MODULATION SIGNALS AND DIGITAL MODULATION SIGNALS

[75] Inventors: Hiroshi Saka, Katano; Kazunao Urata, Tondabayashi, both of Japan

[73] Assignee: Matsushita Electric Industrial Co., Ltd., Osaka, Japan

[21] Appl. No.: 144,422

[22] Filed: Nov. 2, 1993

[30] Foreign Application Priority Data

Nov. 2, 1992 [JP] Japan .................................. 4-294100
Nov. 2, 1992 [JP] Japan .................................. 4-294101
Nov. 2, 1992 [JP] Japan .................................. 4-294102

[51] Int. Cl.$^6$ ................................................ H04B 1/16
[52] U.S. Cl. .................. 455/182.2; 455/142; 455/185.1; 455/192.2; 455/197.1; 375/216; 375/344
[58] Field of Search ............................. 455/142, 179.1, 455/180.1, 182.1–182.3, 183.2, 185.1, 186.1, 189.1, 191.1, 192.1, 192.2, 197.1, 183.1, 196.1, 143, 144; 375/5, 97

[56] References Cited

U.S. PATENT DOCUMENTS 4,339,725  7/1982  Ichyoshi .
4,817,192  3/1989  Phillips et al. ................. 455/182.2 X
5,107,522  4/1992  Kitayama et al. ...................... 375/97
5,163,159  11/1992 Rich et al. ......................... 455/142 X
5,289,506  2/1994  Kitayama et al. ...................... 375/97

Primary Examiner—Chi H. Pham
Attorney, Agent, or Firm—Wenderoth, Lind & Ponack

[57] ABSTRACT

A channel selecting apparatus simultaneously selects both the modulation signals, which are simultaneously received at different channels where modulation signals having a continuous phase and digital modulation signals having a discontinuous phase are located. As both the modulation signals are propagated on the same transmission path or approximately the same inclination of transmission path, modulation signals existing on different channel frequencies suffer approximately similar frequency shift from the transmission path before being inputted to the channel selecting apparatus. Therefore, the frequency of the digitally modulated IF signal can be controlled in accordance with the frequency shift information related to an IF signal having a continuous phase and the frequency of the digitally modulated IF signal may be focused into the comparatively narrow frequency range around the synchronous pull-in frequency of the digital demodulating circuit and the modulation signal having a continuous phase may be focused into the comparatively narrow frequency range around the optimum input frequency of the demodulation circuit.

20 Claims, 11 Drawing Sheets

CHANNEL SELECTING APPARATUS FOR SIMULTANEOUS USE WITH BOTH PHASE-CONTINUOUS MODULATION SIGNALS AND DIGITAL MODULATION SIGNALS

BACKGROUND OF THE INVENTION

The present invention generally relates to a channel selecting apparatus for use in a case where a modulation signal having a continuous phase such as an AM modulation signal, an FM modulation signal, an MSK modulation signal and so on and a digital modulation signal exist at the same time in different frequency areas or different channels, and more particularly, to a channel selecting apparatus for stabilizing a frequency of a digital modulation signal inputted to a digital demodulator in accordance with frequency information to be obtained during at a demodulating process after selecting a channel in which a modulation signal having a continuous phase exists.

At present an FM modulation system is generally used for satellite broadcasting. Satellite digital audio broadcasting by an MSK modulation system has also been realized. Recently, digital satellite broadcasting by a QPSK digital modulation system have also been examined. In the future, satellite broadcasting where an FM modulation system is mixed with a digital modulation system will be considered.

At present, an AM modulation system is used for a modulation system in terrestrial broadcasting. Recently, digital terrestrial broadcasting by a digital multi-level QAM modulation system have also been examined.

Generally a synchronous detection method is used for demodulating digitally modulated signals. In the synchronous detection method, a PLL circuit is required for obtaining reproduced carriers synchronized in phase with the carriers of the digitally modulated signals. In order to improve the performance of the digital demodulating circuit, the frequency pull-in range of the PLL circuit is set so as to be narrow.

It is necessary to stabilize the center frequency of the digital modulation signal inputted into the digital demodulating circuit so that it may stay within the frequency pull-in range of the PLL circuit during the carrier reproduction.

In the satellite broadcasting receiver, a local oscillation frequency of the BS converter may drift by several MHz. A method of compulsorily sweeping an oscillation frequency of a VCO by a frequency sweeping circuit for carrier synchronization provided for a voltage control oscillator (hereinafter referred to as a VCO) when the digital modulation signal is converted in frequency into an intermediate frequency signal (hereinafter referred to as an IF signal) is used as a for the frequency-drift compensating means.

Even in the digital demodulation system, there is a big difference in a method of compensating for the frequency drift of the modulation signal between a digital demodulation system where a QPSK modulation signal or the like having a discontinuous phase is inputted and in a digital demodulation system where an MSK modulation signal or the like having a continuous phase is inputted. In an MSK modulation signal or the like having a continuous phase, a so-called mean value AFC method can be adapted, and the compensation of the frequency drift of the modulation signal is easier to effect. In the QPSK modulation signal, the mean value AFC method cannot be adapted since the phase of the modulation signal is not continuous. In the QPSK demodulation system, the oscillation frequency of the VCO is swept by the frequency sweeping circuit for carrier synchronization provided for a VCO and also, the sweeping frequency range also must be widely set so as to compensate for the local oscillation frequency drift of the BS converter. FIG. 13 shows a channel selecting circuit for conventional digital modulation signal use.

In FIG. 13, a frequency conversion circuit 121 frequency converts the digital modulation signal into an IF signal. The IF signal is transmitted to a digital demodulation circuit 122 and is demodulated, and a digital demodulation signal is outputted. The digital demodulation circuit 122 includes a carrier reproducing circuit 22 for reproducing the carrier.

A channel selection circuit 120 includes a VCO 123, a variable frequency divider 124, a reference oscillator 125, a phase comparator 126, a loop filter 127, and a microprocessor 128. As the VCO 123 is varied in oscillation frequency by a control signal output from the microprocessor 128, the oscillation frequency is widely tuned by channel selecting information inputted to the microprocessor 128 and the local oscillation signal of the VCO 123 is inputted in the frequency conversion circuit 121 and the variable frequency divider 124. The variable frequency divider 124 divides the local oscillation frequency with a frequency dividing ratio set by the microprocessor 128. The output signal of the variable frequency divider 124 is input to the phase comparator 126. The phase comparator 126 compares the phase of the output signal of the variable frequency divider 124 and the phase of the reference oscillator 125 so as to output a phase error signal. The phase error signal is smoothed by a loop filter 127 and is used as a control voltage for controlling the oscillation frequency.

The microprocessor 128 varies the frequency dividing ratio of the variable frequency divider 124 with a frequency dividing ratio set in accordance with the channel selecting information provided as the center frequency dividing ratio so as to sweep the oscillation frequency of the VCO 123 at a predetermined frequency step size. When the carrier frequency of the IF signal approaches an optimum frequency of the carrier reproducing circuit 22 and the carrier is reproduced in synchronism the carrier frequency of the IF signal, the synchronizing detection signal is outputted to the microprocessor 128 from the digital demodulating circuit 122 so as to suspend the variation of the frequency dividing ratio of the variable frequency divider 124.

When the frequency drift of the IF signal inputted to the digital demodulating circuit 122 is large in the above described conventional channel selecting circuit, the frequency sweeping range of the VCO 123 within the channel selecting circuit 120 has to be wider in order that the frequency of the IF signal be within the synchronizing pull-in range of the digital demodulating circuit 122. Consequently, the sweeping time becomes longer and the time to achieve synchronization becomes longer. Since the synchronization acquisition operation is performed from the beginning for each of the channel selecting operations, a problem arises in that the channel tuning time for the access time to synchronization after the channel selecting operation takes a long time.

SUMMARY OF THE INVENTION

Accordingly, the present invention has been developed with a view to substantially eliminating the above discussed drawbacks inherent in the prior art, and has for its essential object to stabilize the synchronization acquisition operation.

Another important object of the present invention is to shorten a synchronization access time after the channel selecting operation.

In accomplishing these and other objects, according to one preferred embodiment of the present invention, there is provided a channel selecting apparatus, which is composed of a channel selecting circuit, for use with a phase-continuous modulation signal, and provided with a first frequency converter for frequency-converting modulation signals having a continuous phase so as to output a first intermediate frequency signal, a first channel selector, provided with a first voltage controlled oscillator for changing an oscillation frequency in accordance with channel selecting information, and adapted to feed to the first frequency convertor circuit the local oscillation signal of the first voltage controlled oscillator, a frequency information detector for detecting the frequency information of the first intermediate frequency signal, a first frequency controller for receiving the frequency information obtained by the frequency information detector, and for finely adjusting the oscillation frequency of the first voltage controlled oscillator so that the carrier frequency of the first intermediate frequency signal stays within the given frequency range, and a channel selector, for use with a digital modulation signal, provided with a second frequency converter for frequency-converting the digital modulation signal so as to output a second intermediate frequency, a second channel selector provided with a second voltage controlled oscillator for changing the oscillation frequency by the channel selecting information so as to feed to the second frequency converter the local oscillation signal of the second voltage controlled oscillator, a second frequency controller for receiving the frequency information obtained by the frequency information detector, and for finely adjusting the oscillation frequency of the second voltage controlled oscillator so that the frequency of the second intermediate frequency signal stays within the given frequency range.

Firstly, when the first frequency controlling means sets the oscillation frequency of the first voltage controlled oscillator in accordance with the channel selecting information of the modulation signal having a continuous phase in the channel selecting apparatus of the above described construction, the modulation signal having a continuous phase which is inputted to the first frequency converting circuit is converted in frequency to the first intermediate frequency signal. The first frequency controlling means receives the frequency information obtained by the frequency information detecting means for detecting the frequency of the first intermediate frequency signal so as to finely adjust the oscillation frequency of the first voltage controlled oscillator so that the frequency of the first intermediate frequency signal stays within the given frequency range. The frequency of the first intermediate frequency signal having a continuous phase is therefore stabilized.

Secondly, when the second frequency controller sets the oscillation frequency of the second voltage controlled oscillator in accordance with the channel selecting information of the digital modulation signal, the digital modulation signal which is inputted to the second frequency converting circuit is converted in frequency to the second intermediate frequency signal.

The second frequency controller receives the frequency information of the first intermediate frequency signal obtained by the frequency information detector so as to finely adjust the oscillation frequency of the second voltage controlled oscillator so that the frequency of the second intermediate frequency signal stays within the given frequency range.

If the same or almost the same adjustment as the fine adjustment of the oscillation frequency of the first voltage control oscillator by the first frequency controller is effected by the second frequency controller for receiving the frequency information of the first intermediate frequency signal obtained by the frequency information detector, since the modulation signal having a continuous phase and the digital modulation signal also suffers through a propagation path from the common frequency drift in the same inclination or almost the same inclination, so that the frequency of the first intermediate frequency signal stays within the given frequency range, the frequency of the second intermediate frequency signal which is digitally modulated also stays within the given frequency range and is stabilized.

When the modulation signal having a continuous phase such as an FM modulation signal exists in accordance with the present invention, an AFC circuit is normally operated with respect to the modulation signal having a continuous phase where the frequency information is easily obtained, and the frequency shift of the digital modulation signal is compensated for by the frequency information data obtained by the AFC circuit in the channel selection of the digital modulated signal. The frequency of IF signal inputted to the digital demodulation circuit is easy to stabilize so that it stays within the given range around the optimum input frequency of the digital demodulation circuit, and the frequency of the IF signal stays within the narrow range around the synchronizing pull-in frequency of the digital demodulating circuit with an effect that the channel tuning time as well as the synchronizing access time of the digital demodulating circuit are shortened.

BRIEF DESCRIPTION OF THE DRAWINGS

These and other objects and features of the present invention will become apparent from the following description of the preferred embodiment thereof with reference to the accompanying drawings, in which.

DETAILED DESCRIPTION OF THE INVENTION

Figure 1:
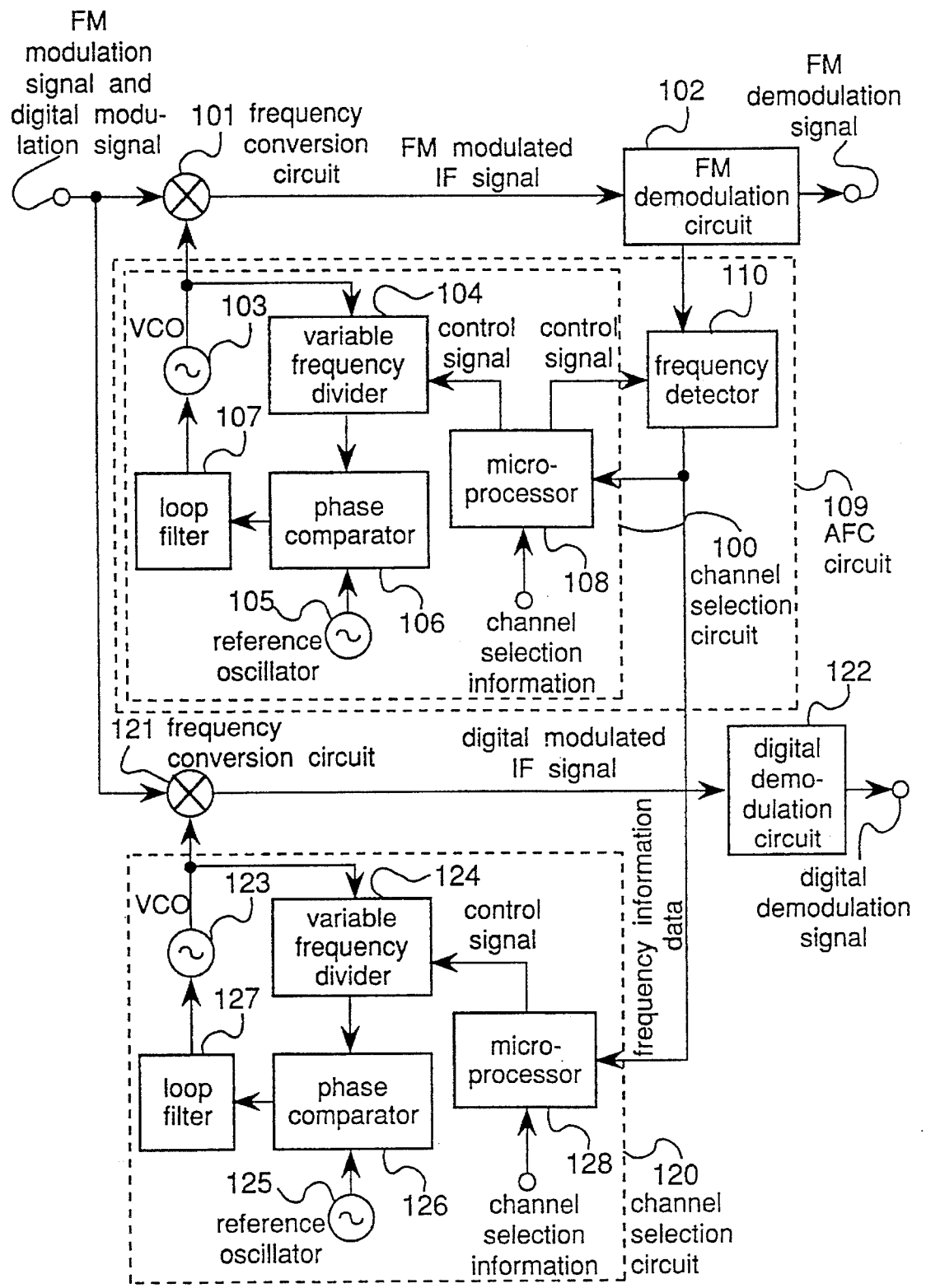
FIG. 1 is a block diagram of a channel selecting apparatus in accordance with a first embodiment of the present invention.

Before the description of the present invention proceeds, it is to be noted that like parts are designated by like reference numerals throughout the accompanying drawings.

FIG. 1 is a channel selecting apparatus in accordance with an embodiment of the present invention. A frequency conversion circuit 101 frequency-converts FM modulation signals into IF signals. The IF signals are fed to an FM demodulating circuit 102 and are demodulated. A channel selection circuit 100 includes a VCO 103, a variable frequency divider 104, a reference oscillator 105, a phase comparator 106, a loop filter 107, and a microprocessor 108. As the VCO 103 varies its oscillator frequency in accordance with a control signal from the microprocessor 108, the oscillation frequency greatly changes in accordance with channel selecting information inputted to the microprocessor 108 and the local oscillation signal of the VCO 103 is inputted to the frequency conversion circuit 101 and the variable frequency divider 104. The variable frequency divider 104 divides the frequency with a frequency dividing ratio set by the microprocessor 108. The frequency division output of the variable frequency divider 104 is fed to the phase comparator 106. The phase comparator 106 compares the phase of the local oscillation signal divided the frequency by the variable frequency divider 104 with the phase of the reference oscillator 105 so as to output a phase error signal. The phase error signal is smoothed by the loop filter 107 and is used as a control voltage for controlling the oscillation frequency of the VCO 103.

An AFC circuit 109 is provided for stabilizing the center frequency of the IF signal outputted from the frequency conversion circuit 101 and includes a frequency detector circuit 110 and the channel selection circuit 100. The frequency detector circuit 110 detects the frequency of a FM-modulated IF signal, and the microprocessor 108 controls the frequency dividing ratio of the variable frequency divider 104 in accordance with the frequency information data obtained by the frequency detector circuit 110, finely adjusts the oscillation frequency of the VCO 103 and keeps the center frequency of the FM-modulated IF signal constant within the given range.

A frequency conversion circuit 121 frequency-converts the digital modulation signal into an IF signal. The IF signal is fed to the digital demodulation circuit 122 and is demodulated.

A channel selection circuit 120 includes a VCO 123, a variable frequency divider 124, a reference oscillator 125, a phase comparator 126, a loop filter 127, and a microprocessor 128. As the VCO 123 varies an oscillation frequency in accordance with a control signal from the microprocessor 128, the oscillation frequency is changed roughly by channel selecting information inputted to the microprocessor 128 and the local oscillation signal of the VCO 123 is inputted to the frequency converting circuit 121 and the variable frequency divider 124. The variable frequency divider 124 divides the local oscillation signal by a frequency dividing ratio set by the microprocessor 128. The frequency divided output of the variable frequency divider 124 is fed to the phase comparator 126. The phase comparator 126 compares in phase the local oscillation signal divided in frequency by the variable frequency divider 124 with the signal output by the reference oscillator 125 so as to output a phase error signal. The phase error signal is smoothed and is used as a control voltage for controlling the oscillation frequency of the VCO 123.

The frequency information data obtained by the frequency detector circuit 110 is fed at the same time to the microprocessor 128 so as to control the frequency dividing ratio of the variable frequency divider 124 included in the channel selection circuit 120 in accordance with the frequency information data, and the oscillation frequency of the VCO 123 is finely adjusted so as to maintain constant within the given range the center frequency of the digitally modulated IF signal.

The operation of the channel selecting apparatus in accordance with the embodiment of FIG. 1 described hereinafter. When the channel selecting information where an FM modulation signal exists is inputted to the microprocessor 108, the frequency dividing ratio corresponding to the channel selecting information is set in the variable frequency divider 104. The VCO 103 feeds to the frequency conversion circuit 101 the local oscillation signal corresponding to the set frequency dividing ratio. The frequency conversion circuit 101 converts the FM modulation signal into an IF signal.

The frequency detecting circuit 110 is controlled by the microprocessor 108 so as to detect the frequency of the FM-modulated IF signal. The frequency information data is fed to the microprocessor 108. The microprocessor 108 calculates, in accordance with the frequency information data, the frequency error between the frequency of the FM-modulated IF signal and the optimum input frequency of the IF signal to be inputted to the FM demodulation circuit 102 so as to finely adjust the frequency dividing ratio of the variable frequency divider 104 with respect to the frequency error so that the frequency of the FM-modulated IF signal may stay within the given range around the optimum input frequency of the FM demodulation circuit 102.

When the channel selecting information where the digital modulating signal exists is inputted to the microprocessor 128, the frequency dividing ratio corresponding to the channel selecting information is fed to the variable frequency divider 124 so that the VCO 123 feeds the local oscillation signal corresponding to the set frequency dividing ratio to the frequency conversion circuit 121. The frequency conversion circuit 121 converts the digital modulation signal into an IF signal.

The frequency information data of the FM modulation signal obtained by the frequency detector circuit 110 is fed at the same time to the microprocessor 128. The microprocessor 128 calculates the frequency error between the frequency of the digitally modulated IF signal and the optimum input frequency of the digital demodulation circuit 122, and finely adjusts the frequency dividing ratio of the variable frequency divider 124 in accordance with the frequency error. The frequency of the IF signal inputted to the digital demodulation circuit 122 is stabilized so that it may stay within the given range around the optimum input frequency.

The frequency of the IF signal inputted to the digital demodulation circuit 122 can be stabilized so that it may stay within the given range around the optimum input frequency in accordance with the frequency information data of the FM demodulated IF signal obtained by the frequency detector circuit 110, because both the FM modulation signal and the digital modulation signal receive a common frequency drift of the same or almost the same inclination through a propagation path and the frequency variation amount that the FM modulation signal receives through a propagation path is equal or almost equal to the frequency variation amount that of the digital modulation signal receives through the propagation path so that the frequency difference between the FM modulation signal inputted to the frequency conversion circuit 101 and the digital modulation signal inputted to the frequency conversion circuit 121 is equal to the frequency difference between the nominal channels.

The embodiment of the present invention in FIG. 1 is a method of controlling the oscillation frequency of the VCO 123 by the frequency information data obtained by the AFC circuit 109 being normally operated and to be easily constituted with respect to the FM modulation signal, and reducing the frequency shift from the optimum input frequency of the digitally modulated IF signal. The frequency of the IF signal to be inputted to the digital demodulation circuit 122 can be easily stabilized so that it may stay within a constant range around the optimum input frequency, and the frequency of the IF signal stays within relatively narrower range around the synchronizing pull-in frequency of the digital demodulation circuit 122 so that the channel tuning time as well as the synchronizing access time of the digital demodulation circuit 122 are also shortened.

Figure 2:
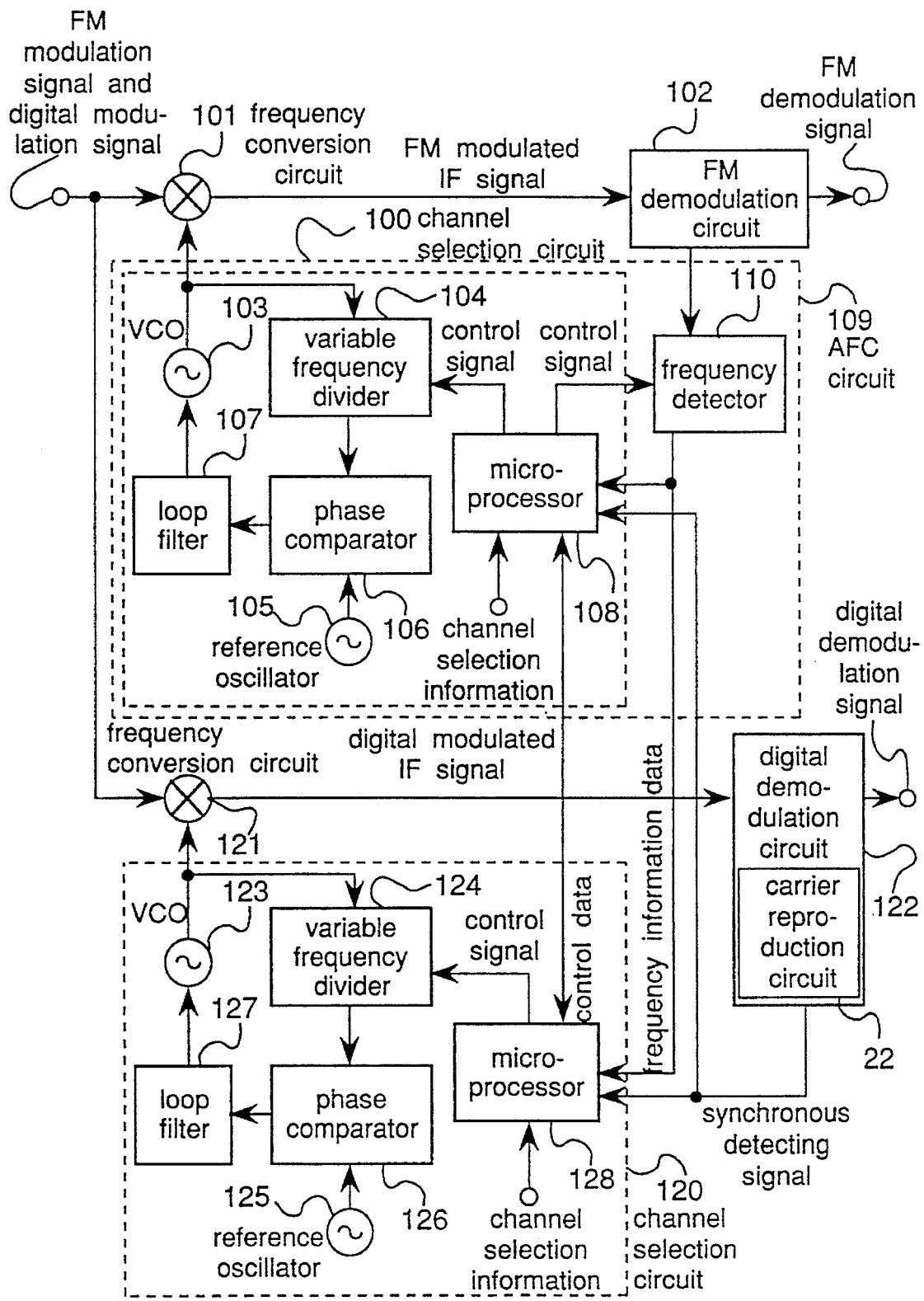
FIG. 2 is a block diagram of a channel selecting apparatus in accordance with a second embodiment of the present invention.

FIG. 2 is a channel selecting apparatus in accordance with another embodiment of the present invention. The same reference numerals are given to the same elements as those of FIG. 1. The digital demodulation circuit 122 includes a carrier reproduction circuit 22 for reproducing the carrier. When the carrier reproducing operation is effected by the carrier reproducing circuit 22, synchronizing detecting signals are fed to the microprocessors 108 and 128 from the digital demodulation circuit 122. In the embodiment of FIG. 1, the oscillation frequency of the VCOs 103 and 123 are controlled in accordance with only the frequency information data obtained by the frequency detector circuit 110, but the embodiment of FIG. 2 is different from the embodiment of FIG. 1 in that the oscillation frequency of the VCOs 103 and 123 are controlled by a synchronizing detecting signal obtained by the digital demodulating circuit 122 as well as by the frequency information data.

The operation of the channel selecting apparatus is described as follows for the embodiment of FIG. 2. When the channel selecting information where the FM modulation signal exists is inputted to the microprocessor 108, the frequency dividing ratio corresponding to the channel selecting information is fed to the variable frequency divider 104. The VCO 103 feeds the local oscillation signal corresponding to the set frequency dividing ratio to the frequency conversion circuit 101. The frequency conversion circuit 101 converts the FM modulation signal to the IF signal.

The frequency detector circuit 110 is controlled by the microprocessor 108, and the frequency of the FM modulated IF signal is detected to feed the frequency information data to the microprocessor 108. The microprocessor 108 calculates the frequency error between the frequency of the FM modulated IF signal and the optimum input frequency of the IF signal to be inputted to the FM demodulation circuit 102 in accordance with the frequency information data so as to finely adjust the frequency dividing ratio of the variable frequency divider 104 in accordance with the frequency error and stabilizes it so that the frequency of the FM modulated IF signal may stay within the given range around the optimum input frequency of the FM demodulation circuit 102.

When the channel selecting information where digital modulation signals exist is inputted to the microprocessor 128, a frequency dividing ratio is set in the variable frequency divider 124 in accordance with the channel selecting information and the frequency information data obtained by the frequency detector circuit 110, and the VCO 123 feeds the local oscillation signal corresponding to the set frequency dividing ratio to the frequency conversion circuit 121. The frequency conversion circuit 121 converts the digital modulation signal to the IF signal. The frequency of the IF signal inputted to the digital demodulation circuit 122 is stabilized so that it may stay within the given range around the optimum input frequency of the digital demodulation circuit 122.

The frequency of the IF signal to be inputted to the digital demodulation circuit 122 stays within the constant range around the optimum input frequency, and at the same time, the microprocessor 128 forces the frequency dividing ratio of the variable frequency divider 124 to be varied around the set frequency dividing ratio so that the oscillation frequency of the VCO 123 is swept at the given frequency step size. The frequency of the IF signal approaches the optimum frequency of the carrier reproduction circuit 22. When the carrier reproduction is effected by the carrier reproduction circuit 22, the synchronizing detecting signal is outputted to the microprocessor 128 from the digital demodulation circuit 122 so as to stop the variation of the frequency dividing ratio of the variable frequency divider 124.

When the FM modulation signal does not exist, the first channel selecting information where the digital modulation signal exists is inputted to the microprocessor 128 so as to set the frequency dividing ratio corresponding to the channel selecting information to the variable frequency divider 124, and so that the VCO 123 feeds to the frequency conversion circuit 121 the local oscillation signal corresponding to the set frequency dividing ratio. The frequency conversion circuit 121 converts the digital modulating signal into the IF signal. The microprocessor 128 forces the frequency dividing ratio of the variable frequency divider 124 to be varied around the frequency dividing ratio to be set in accordance to the first channel selecting information for sweeping the oscillation frequency of the VCO 123 at a given frequency step size. The variable range of the frequency dividing ratio of the variable frequency divider 124 is set so that the frequency of the digital modulated IF signal may be changed sufficiently over the frequency variation amount that the digital modulation signal suffers through a propagation path. When the frequency of the IF signal approaches the optimum frequency of the carrier reproducing circuit 22 so as to effect the carrier reproducing operation, the synchronizing detection signal is outputted to the microprocessor 128 from the digital demodulation circuit 122 for suspending the variation of the frequency dividing ratio of the variable frequency divider 124.

The microprocessor 108 receives the frequency dividing ratio of the variable frequency divider 124 from the microprocessor 128 while the synchronizing detection signal is outputted from the digital demodulation circuit 122. On the side of the microprocessor 108, the frequency dividing ratio of the variable frequency divider 124 at the carrier reproducing period, instead of the frequency information data to be obtained by the frequency detector circuit 110, is preserved while being normally renewed. When the synchronization of the carrier reproduction circuit 22 is lost, the frequency dividing ratio of the variable frequency divider 124 is, first, set in accordance with the newest frequency dividing ratio of the variable frequency divider 124 which is preserved in the microprocessor 108.

The microprocessor 128 forces the frequency dividing ratio of the variable frequency divider 124 to vary around the set frequency dividing ratio to sweep the oscillation frequency of the VCO 123 at a given frequency step size. As the carrier frequency of the digitally modulated IF signal is already retained constant within the given range and is stabilized, the variable range of the frequency dividing ratio of the variable frequency divider 124 is sufficient if it is enough to make up for the frequency variation amount of the stabilized IF signal. When the frequency of the IF signal approaches the optimum frequency of the carrier reproduction circuit 22 so as to effect the carrier reproduction again, the synchronizing detection signal is outputted to the microprocessor 128 from the digital demodulation circuit 122 for suspending the variation of the frequency dividing ratio of the variable frequency divider 124.

The embodiment of the present invention in FIG. 2 is a method of normally operating the AFC circuit 109 when the FM modulation signal exists with respect to the FM modulation signal for which the frequency can be easily detected, controlling the frequency dividing ratio of the variable frequency divider 124 for the digital modulation signal use by the frequency information data obtained by the AFC circuit 109, and reducing the frequency shift of the IF signal from the optimum input frequency of the digital demodulation circuit 122. Consequently, the IF signal to be inputted to the digital demodulation circuit 122 can be easily stabilized so that it may stay within the constant range around the optimum input frequency. The frequency of the IF signal stays within a relatively narrow constant range around the synchronizing pull-in frequency of the digital demodulation circuit 122 so that both the synchronizing access time of the digital demodulating circuit 122 and the channel tuning time can be also shortened.

When the FM modulation signal does not exist, a relatively long time is taken to acquire a synchronizing operation immediately after the first channel selecting information where the digital modulation signal exists has been inputted to the microprocessor 128. Once the carrier reproduction is established, the frequency dividing ratio of the variable frequency divider 124 when the carrier reproducing operation of the digital demodulation circuit 122 is effected is fed to the side of the microprocessor 108 from the microprocessor 128 so as to preserve the frequency dividing ratio of the variable frequency divider 124 at the carrier reproduction period while it is normally being renewed on the side of the microprocessor 108. If the synchronization of the carrier reproduction circuit 22 is lost, the frequency dividing ratio of the variable frequency divider 124 is first set in accordance with the newest frequency dividing ratio of the variable frequency divider 124 which is preserved on the microprocessor 108 at the synchronizing period. Next, the microprocessor 128 forces the frequency dividing ratio of the variable frequency divider 124 to be varied around the set frequency dividing ratio so as to sweep the oscillation frequency of the VCO 123 at a given frequency step size. As the carrier frequency of the digitally modulated IF signal is already retained constantly within the given range, the variable range when the frequency dividing ratio of the variable frequency divider 124 is forced to be varied is sufficient to make up for the frequency shift of the IF signal already stabilized from the optimum input frequency of the digital demodulation circuit 122. Both the synchronizing access time and the channel tuning time are shortened.

Figure 3:
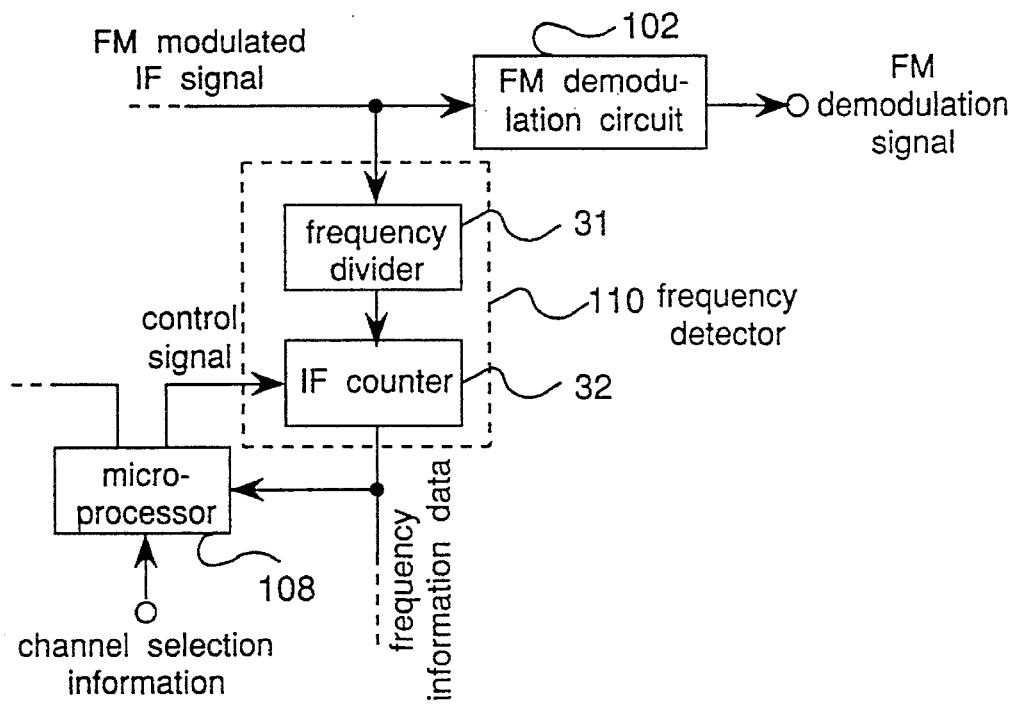
FIG. 3 is a block diagram showing one example of a frequency detecting circuit in accordance with the embodiments of FIG. 1 and FIG. 2 of the present invention.

FIG. 3 is a view showing one example of a frequency detector circuit 110 shown in FIG. 1 and FIG. 2. The frequency detector circuit 110 includes a frequency divider 31 and an IF counter 32. The frequency divider 31 divides the frequency of the FM-modulated IF signal. The IF counter 32 counts the frequency of the output signal of the frequency divider 31. The microprocessor 108 controls the IF counter 32 so that the frequency of the output signal of the frequency divider 31 is counted for a constant period by the IF counter 32 so as to receive a frequency information data counted by an IF counter 32. The microprocessor 108 compares a received frequency information data with reference data set previously within the microprocessor 108. In accordance with the comparison results, the frequency error between the frequency of the FM-modulated IF signal and the optimum input frequency of the FM demodulation circuit 102 is calculated. The frequency dividing ratio of the variable frequency divider 104 is finely adjusted in accordance with the frequency error and the frequency of the FM modulated IF signal is stabilized so that it may stay within the constant range around the optimum input frequency.

Figure 4:
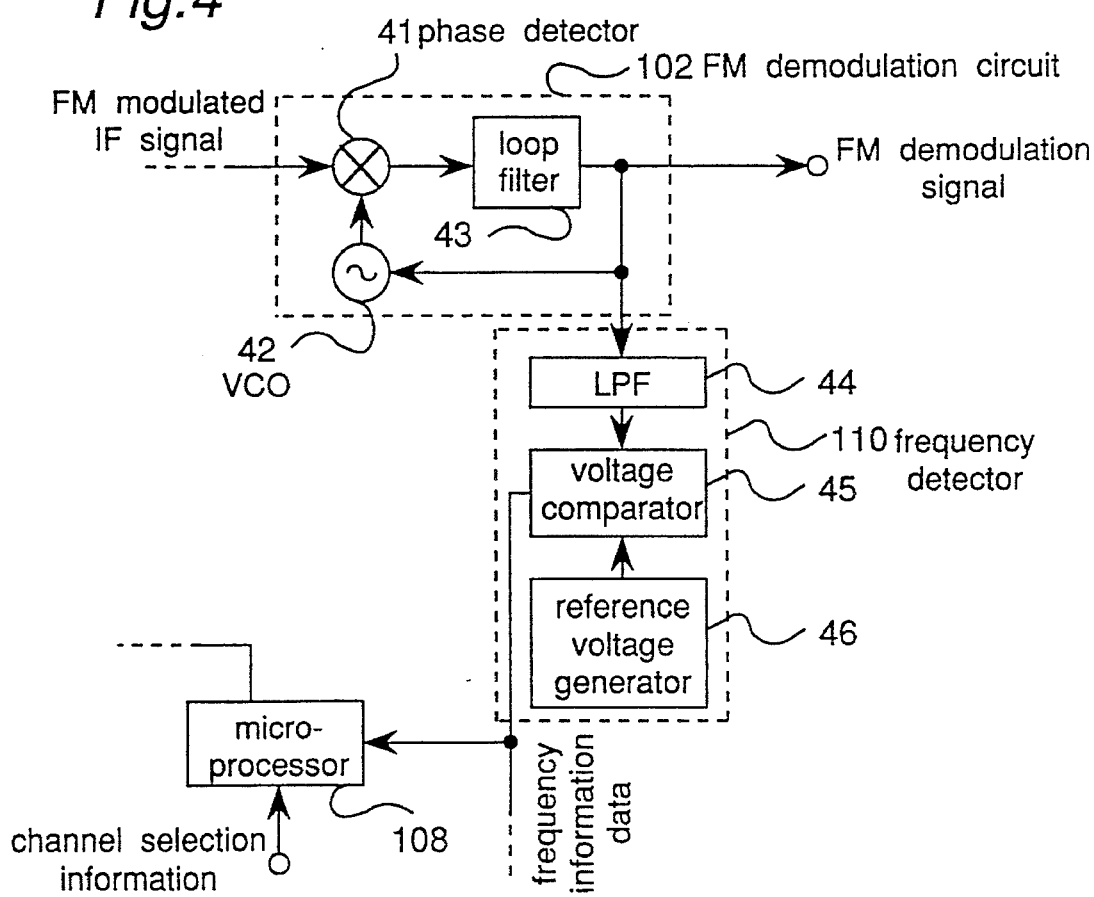
FIG. 4 is a block diagram showing another example of a frequency detecting circuit in accordance with the embodiments of FIG. 1 and FIG. 2 of the present invention.

FIG. 4 is a view showing another embodiment of the frequency detector circuit 110 shown in FIG. 1 and FIG. 2. The FM demodulation circuit 102 includes a phase detector 41, a VCO 42 and a loop filter 43 and is a PLL-type. The frequency detector circuit 110 includes a low-pass filter 44 (referred to as an LPF), a voltage comparator 45 and a reference voltage generator 46.

The direct current component of an FM demodulation signal which is an output signal of the loop filter 43 is extracted by the LPF 44. The voltage comparator 45 compares the direct current component extracted by the LPF 44 with the reference voltage of the reference voltage generator 46 so as to output the voltage error signal as frequency information data. As the direct current component of the FM demodulation signal corresponds to the particular frequency of the FM modulation signal such as the mean frequency, the voltage error signal of the voltage comparator 45 corresponds in a 1 to 1 fashion with the frequency information data of the FM-modulated IF signal. The microprocessor 108 receives the voltage error signal as the frequency information data of the FM-modulated IF signal. The microprocessor 108 calculates the frequency error between the frequency of the FM-modulated IF signal and the optimum input frequency of the FM demodulation circuit 102 in accordance with the level of the received voltage error signal, finely adjusts the frequency dividing ratio of the variable frequency divider 104 in accordance with the frequency error, and the frequency of the FM-modulated IF signal is stabilized so that it may stay within a constant range around the optimum input frequency.

Although the reference voltage generator 46 is located independently of the microprocessor 108 in the embodiment of the FIG. 4, the reference voltage of the reference voltage generator 46 may be controlled by the microprocessor 108.

Figure 5:
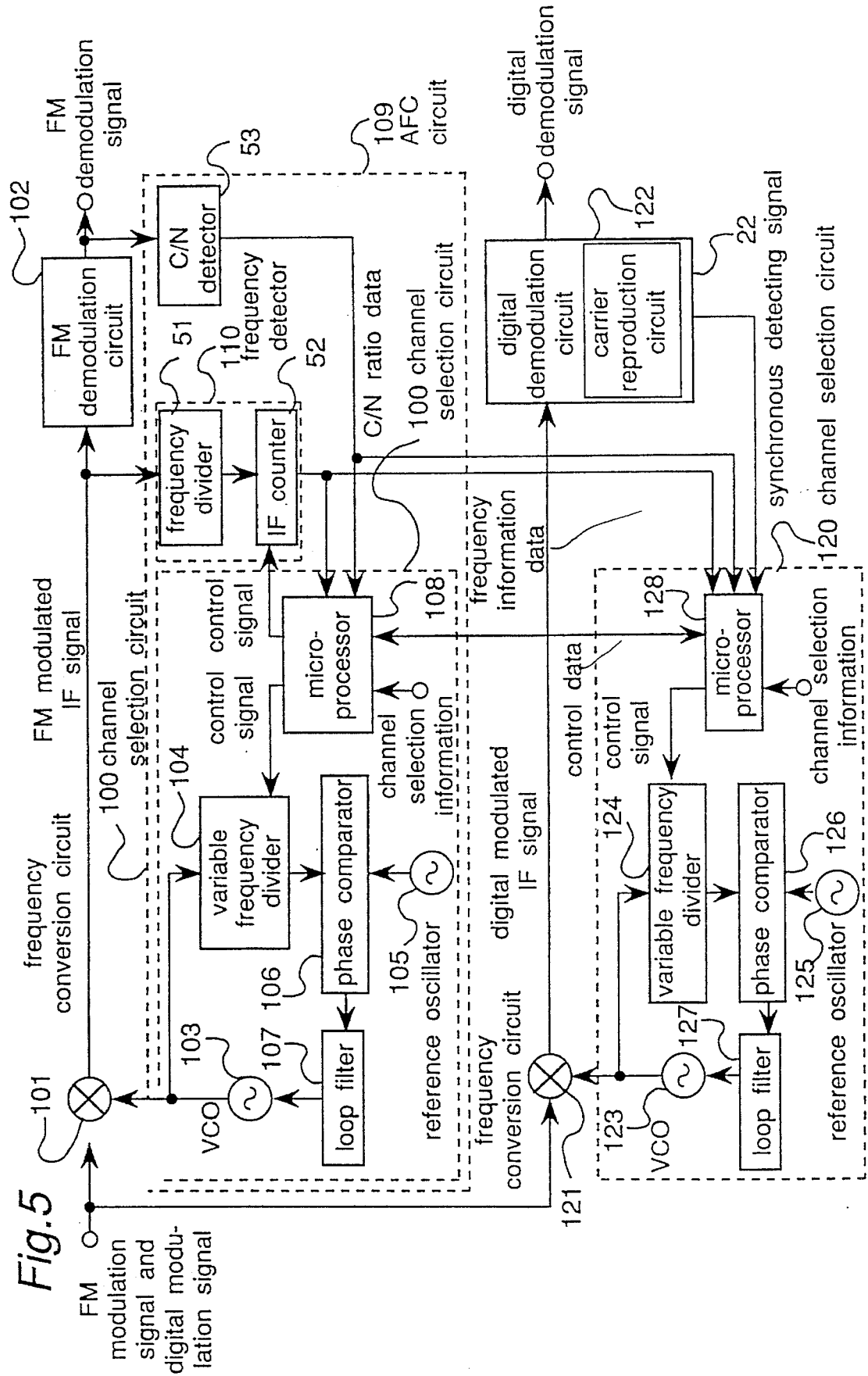
FIG. 5 is a block diagram of a channel selecting apparatus in accordance with a third embodiment of the present invention.

FIG. 5 is a channel selecting apparatus in a still another embodiment by the present invention. The AFC circuit 109 is provided for stabilizing the center frequency of the IF signal outputted from the frequency conversion circuit 101 and includes a frequency divider 51, an IF counter 52, a channel selection circuit 100 and a carrier-to-noise ratio (hereinafter referred to as C/N) detector circuit 53. The frequency divider 51 divides the FM-modulated IF signal and the IF counter 52 counts the frequency of the output signal of the frequency divider 51.

The operation of the channel selecting apparatus is the embodiment of FIG. 5 is described hereinafter. When the channel selecting information where FM modulation signal exists is inputted to the microprocessor 108, the frequency dividing ratio corresponding to the channel selecting information is set in the variable frequency divider 104 and the VCO 103 feeds the local oscillation signal corresponding to the frequency dividing ratio to the frequency conversion circuit 101. The frequency conversion circuit 101 converts the FM modulation signal to the IF signal. The IF signal is fed to the FM demodulating circuit 102 and is demodulated.

The microprocessor 108 controls the IF counter 52 so that the frequency the output signal of the frequency divider 51 is counted for a given constant period by the IF counter 52 so as to receive the frequency information data obtained by the IF counter 52 and also, the C/N ratio data obtained by the C/N detector circuit 53. The microprocessor 108 sets the reference data to be compared with the frequency information data obtained by the IF counter 52 in accordance with the received C/N ratio data and also, compares the received frequency information data with the set reference data and calculates the frequency error between the frequency of the FM-modulated IF signal and the optimum input frequency of the IF signal to be inputted to the FM demodulation circuit 102 in accordance with comparison result. The frequency dividing ratio of the variable frequency divider 104 is finely adjusted in accordance with the frequency error. The frequency of the FM modulated IF signal is stabilized so that it may stay within a constant range around the optimum input frequency of the FM demodulation circuit 102. The reason why the reference data is set in accordance with the C/N ratio data obtained by the C/N detecting circuit 53 will be given in the description of FIG. 7.

When the channel selecting information where the digital modulation signal exists is inputted to the microprocessor 128, the frequency dividing ratio corresponding to the channel selecting information is set in the variable frequency divider 124 by the microprocessor 128 and the VCO 123 feeds the local oscillation signal corresponding to the frequency dividing ratio to the frequency conversion circuit 121. The frequency conversion circuit 121 converts the digital modulation signal to the IF signal.

The C/N ratio data detected by the C/N detector circuit 53 and the frequency information data obtained by the IF counter 52 are fed to the microprocessor 128. The microprocessor 128 newly sets the new reference data for digital demodulation use to be compared with the frequency information data obtained by the IF counter 52 in accordance with the C/N ratio data and also compares the frequency information data with the new reference data for digital demodulation use. The frequency error between the frequency of the digitally modulated IF signal and the optimum input frequency of the digital demodulation circuit 122 is calculated in accordance with the comparison result. The frequency dividing ratio of the variable frequency divider 124 is controlled in accordance with the frequency error so as to finely adjust the oscillation frequency of the VCO 123 and to keep the carrier frequency of the digitally modulated IF signal constant within the given range and the frequency of the IF signal to be inputted to the digital demodulation circuit 122 is stabilized so that it may stay within a constant range around the optimum input frequency.

After the IF signal inputted to the digital demodulation circuit 122 is held within the constant range around the optimum input frequency, the microprocessor 128 forces the frequency dividing ratio of the variable frequency divider 124 to vary around the set frequency division ratio so as to sweep the oscillation frequency of the VCO 123 at a given frequency step size. When the frequency of the IF signal approaches the optimum frequency of the carrier reproduction circuit 22 to effect the carrier reproducing operation, the synchronization detecting signal is outputted to the microprocessor 128 from the digital demodulation circuit 122 so as to suspend the variation of the frequency division ratio of the variable frequency divider 124.

In the embodiment of the FIG. 5, the AFC circuit 109 is normally operated with respect to the FM modulation signal for which the AFC circuit 109 can be constructed easily. The oscillation frequency of the VCO 123 is controlled by the frequency information data of the FM modulation signal obtained by the AFC circuit 109 so as to reduce the shift from the optimum input frequency of the digital demodulation circuit 122. Since the method is a method of compulsorily sweeping the frequency of the VCO 123 so as to cause the synchronizing acquisition operation of the digital demodulation circuit 122 after reducing the shift, the IF signal inputted to the digital demodulation circuit 122 can be easily stabilized so that it may stay within the relatively narrow constant range around the optimum input frequency and the frequency of the IF signal may stay within the relatively narrow constant range around the synchronizing pull-in frequency of the digital demodulation circuit 122, so that both the synchronizing access time of the digital demodulation circuit 122 and the channel tuning time are shortened. Since it is a method of improving the accuracy of the frequency information data of the FM modulation signal by using the C/N ratio data obtained by the C/N detecting circuit 53, the accurate frequency information data of the FM modulations signal can be obtained even at the low C/N ratio with a similar effect even in the low C/N ratio.

Figure 6:
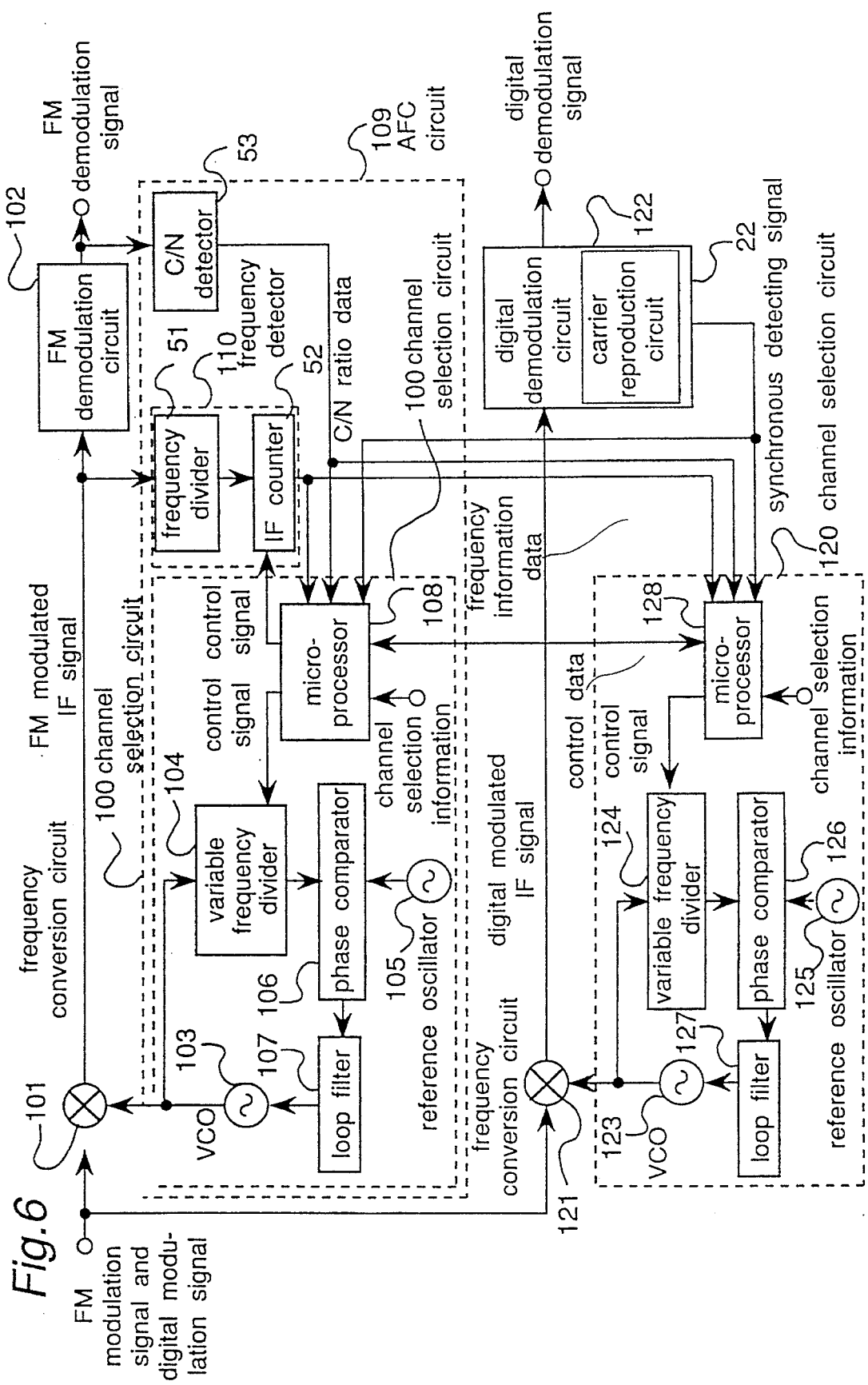
FIG. 6 is a block diagram of a channel selecting apparatus in accordance with a fourth embodiment of the present invention.

FIG. 6 is a channel selecting apparatus in accordance with a further embodiment of the present invention. Although the synchronizing detection signal obtained by the digital demodulation circuit 122 is used only in the controlling operation of the oscillation frequency of the VCO 123 in the embodiment of FIG. 5 the embodiment of FIG. 6 is different from FIG. 5 in that it is used in the control of the oscillation frequencies of not only the VCO 123, but also the VCO 103.

The operation of the channel selecting apparatus by the embodiment of FIG. 6 described hereinafter. When the channel selecting information where FM modulating signal exists is inputted to the microprocessor 108, the frequency dividing ratio corresponding to the channel selecting information by the microprocessor 108 is set in the variable frequency divider 104 so as to feed the local oscillation signal corresponding to the frequency dividing ratio to the frequency conversion circuit 101. The frequency conversion circuit 101 converts the FM modulation signal to the IF signal. The IF signal is fed to the FM demodulation circuit 102 and is demodulated.

The microprocessor 108 controls the IF counter 52 so that the frequency of the output signal of the frequency divider 51 is counted for a constant period of time by the IF counter 52 so as to receive the frequency information data obtained by the IF counter 52 and receive the C/N ratio data obtained by the C/N detector circuit 53. The microprocessor 108 sets the reference data compared with the frequency information data obtained by the IF counter 52 in accordance with the received C/N ratio data, and also, compares the received frequency information data with the set reference data. The frequency error between the frequency of the FM modulated IF signal and the optimum input frequency of the IF signal inputted to the FM demodulation circuit 102 is calculated. The frequency dividing ratio of the variable frequency divider 104 is finely adjusted in accordance with the frequency error. The frequency of the FM modulated IF signal is stabilized so that it may stay within the constant range around the optimum input frequency of the FM demodulating circuit 102. The reason why the reference data is set in accordance with the C/N ratio data obtained by the C/N detecting circuit 53 is described with respect in FIG. 7.

When the channel selecting information where the digital modulation signal exists is inputted to the microprocessor 128, the frequency division ratio corresponding to the channel selecting information is set in the variable frequency divider 124, and the VCO 123 feeds to the frequency conversion circuit 121 the local oscillation signal corresponding to the frequency dividing ratio. The frequency converting circuit 121 converts the digital modulation signal into the IF signal.

The C/N ratio data detected by the C/N detecting circuit 53 and the frequency information data obtained by the IF counter 52 are fed to the microprocessor 128. The microprocessor 128 newly sets the new reference data for digital demodulation use to be compared with the frequency information data obtained by the IF counter 52 and also, compares the frequency information data with the new reference data for digital demodulation use. The frequency error between the frequency of the digitally modulated IF signal and the optimum input frequency of the digital demodulation circuit 122 is calculated in accordance with the comparison result. The frequency dividing ratio of the variable frequency divider 124 is controlled in accordance with the frequency error so as to finely adjust the oscillation frequency of the VCO 123 and to retain constantly the frequency of the digitally modulated IF signal within the given range and the frequency of the IF signal inputted to the digital demodulation circuit 122 is stabilized so that it may stay within the constant range around the optimum input frequency.

After the IF signal inputted to the digital demodulation circuit 122 is held within the constant range around the optimum input frequency, the microprocessor 128 compulsorily varies the frequency dividing ratio of the variable frequency divider 124 around the set frequency dividing ratio so as to sweep the oscillation frequency of the VCO 123 at a given frequency step size. When the frequency of the IF signal approaches the optimum frequency of the carrier reproduction circuit 22 so as to effect a carrier reproducing operation, the synchronizing detection signal is outputted to the microprocessor 128 from the digital demodulation circuit 122 so as to suspend the variation of the frequency dividing ratio of the variable frequency divider 124.

When the FM modulation signal does not exist, the first channel selecting information where the digital modulation signal exists is inputted to the microprocessor 128 so as to set the frequency dividing ratio corresponding to the channel selecting information to the variable frequency divider 124 by the microprocessor 128, and so that the VCO 123 feeds to the frequency conversion circuit 121 the local oscillation signal corresponding to the set frequency dividing ratio. The frequency conversion circuit 121 converts the digital modulating signal into the IF signal. The microprocessor 128 forces the frequency dividing ratio of the variable frequency divider 124 to be varied around the frequency dividing ratio set in accordance with the first channel selecting information for sweeping the oscillation frequency of the VCO 123 at a given frequency step size. The variable range of the frequency dividing ratio of the variable frequency divider 124 is set so that the frequency of the digital modulated IF signal may be changed sufficiently over the frequency variation amount that the digital modulation signal suffers from through a propagation path. When the frequency of the IF signal approaches the optimum frequency of the carrier reproduction circuit 22 so as to effect the carrier reproducing operation, the synchronizing detection signal is outputted to the microprocessor 128 from the digital demodulation circuit 122 for suspending the variation of the frequency dividing ratio of the variable frequency divider 124.

The microprocessor 108 receives the frequency dividing ratio of the variable frequency divider 124 from the microprocessor 128 while the synchronizing detection signal is outputted from the digital demodulation circuit 122. On the side of the microprocessor 108, the frequency dividing ratio of the variable frequency divider 124 at the carrier reproducing period, instead of the frequency information data of the FM modulated IF signal obtained by the AFC circuit 109, is preserved while being normally renewed. When the synchronization of the carrier reproduction circuit 22 is lost, the frequency dividing ratio of the variable frequency divider 124 is set in accordance with the newest frequency dividing ratio of the variable frequency divider 124 which is preserved in the microprocessor 108. Next, the microprocessor 128 forces the frequency dividing ratio of the variable frequency divider 124 to vary around the set frequency dividing ratio to sweep the oscillation frequency of the VCO 123 at a given frequency step size. As the carrier frequency of the digitally modulated IF signal is already retained constant within the given range, the variable range of the frequency dividing ratio of the variable frequency divider 124 is sufficient if it is enough to make up for the frequency variation amount of the stabilized IF signal. When the frequency of the IF signal approaches the optimum frequency of the carrier reproduction circuit 22 so as to effect the carrier reproduction again, the synchronizing detection signal is outputted to the microprocessor 128 from the digital demodulation circuit 122 for suspending the variation of the frequency dividing ratio of the variable frequency divider 124.

In the embodiment of the present invention shown in FIG. 6, the AFC circuit 109 is normally operated with respect to the FM modulation signal for which the frequency can be easily detected when the FM modulation signal exists. The frequency dividing ratio of the variable frequency divider 124 for the digital modulating signal use is controlled by the frequency information data obtained by the AFC circuit 109, and the frequency shift of the digital demodulated IF signal from the optimum input frequency of the digital demodulation circuit 122 is reduced. Thereafter, the frequency of the VCO 123 is compulsorily swept so as to cause the synchronizing operation of the digital demodulation circuit 122. Consequently, the frequency of the IF signal inputted to the digital demodulation circuit 122 can be easily stabilized so that it may stay within the relatively narrow constant range around the optimum input frequency and the frequency of the IF signal may stay within the relatively narrow constant range around the synchronizing pull-in frequency of the digital demodulation circuit 122, so that both the synchronizing access time of the digital demodulation circuit 122 and the channel tuning time are shortened. Furthermore, since the method is a method of improving the accuracy of the frequency information data of the FM modulation signal by using the C/N ratio data obtained by the C/N detecting circuit 53, the accurate frequency information data of the FM modulation signal can be obtained even at a low C/N ratio with an effect that both the synchronizing access time and the channel tuning time are shortened even with a low C/N ratio.

When the FM modulation signal does not exist, a relatively long time is taken to acquire a synchronizing operation immediately after the first channel selecting information where the digital modulation signal exists has been inputted into the microprocessor 128. Once the carrier reproduction is established, the frequency division ratio of the variable frequency divider 124 when the carrier reproducing operation of the digital demodulation circuit 122 is effected is fed to the microprocessor 108 from the microprocessor 128 so as to preserve the frequency dividing ratio of the variable frequency divider 124 during the carrier reproduction period while it is normally being renewed on the side of the microprocessor 108. If the synchronization of the carrier reproduction circuit 22 is lost, the frequency dividing ratio of the variable frequency divider 124 within the channel selection circuit 120 is first set in accordance with the newest frequency dividing ratio of the variable frequency divider 124 which is preserved in the microprocessor 108 during the synchronizing period. Next, the microprocessor 128 forces the frequency dividing ratio of the variable frequency divider 124 to be varied around the set frequency dividing ratio so as to sweep the oscillation frequency of the VCO 123 at a given frequency step size. Since the carrier frequency of the digitally modulated IF signal is already retained constantly within the given range, the variable range when the frequency dividing ratio of the variable frequency divider 124 is forced to be varied is sufficient if it is enough to make up for the shift from the optimum input frequency of the digital demodulation circuit 122. Both the synchronizing access time and the channel tuning time are shortened.

Figure 7:
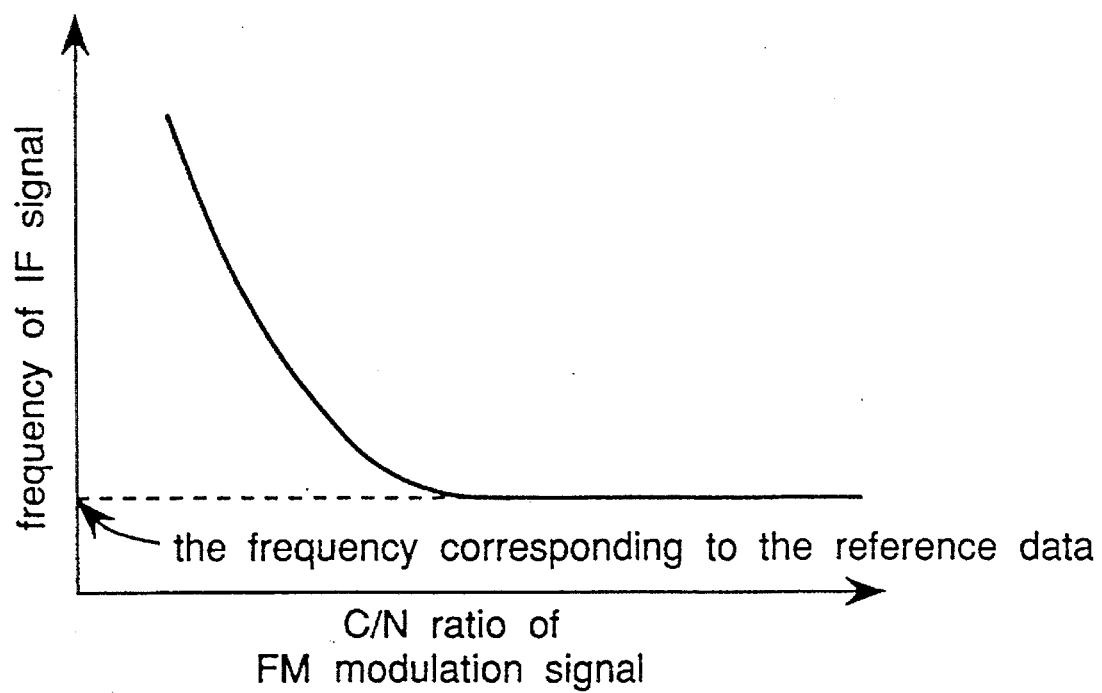
FIG. 7 is a diagram showing a frequency variation of an FM-modulated IF signal with respect to C/N ratio when a C/N ratio data detected by a C/N detecting circuit is not used for controlling a VCO in the embodiments of FIG. 5 and FIG. 6.

FIG. 7 is a view showing the variation of the center frequency of the IF signal where the C/N ratio of the FM modulation signal has been changed with the fixed center frequency of the FM modulation signal to be inputted to the frequency conversion circuit 101 when the C/N ratio data obtained by the C/N detecting circuit 53 is not used for controlling the VCO 103 in the embodiments of FIG. 5 and FIG. 6. There is no problem when the C/N ratio of the FM modulation signal is high as shown in FIG. 7, because the frequency of the IF signal conforms to the frequency corresponding to the reference data. As the C/N ratio becomes lower, the frequency of the output signal of the variable frequency divider 51 becomes higher because of noise, and the frequency error between the frequency information data obtained by the IF counter 52 and the reference data is increased. The frequency error increases as the C/N ratio becomes lower. When the setting of the reference data by the C/N ratio is not changed, it is understood that the frequency of the FM modulated IF signal is shifted from the optimum input frequency of the FM demodulating circuit 102. In the embodiments of FIG. 5 and FIG. 6, the constant reference data compared with the frequency information data obtained by the IF counter 52 is set to a level where the C/N ratio is a certain level or more and the reference data is set higher as the C/N ratio is lower in a level where the C/N ratio is a certain level or lower.

In the embodiments of FIG. 5 and FIG. 6, the C/N detecting circuit 53 is provided on the output side of the FM demodulator circuit 102 and the C/N ratio concerning the FM modulating signal is detected. The circuit is not always required to be provided on the output side of the FM demodulation circuit 102. It may be provided on the input side or on the output side of the frequency conversion circuit 101. If a method is a method capable of effecting the C/N ratio detecting operation, the detecting means of the C/N ratio is not restricted to the above-noted particular method.

In the embodiments of FIG. 1, FIG. 2, FIG. 3, FIG. 4, FIG. 5 and FIG. 6, an FM modulation signal which establishes the so-called mean value AFC is inputted in the description of the frequency detector circuit 110 of the AFC circuit 109. In the channel selecting apparatus of the present invention, such an FM modulation signal as the keyed AFC signal is outputted can be inputted. An output signal of an AFC circuit 109 may be needless to say, a keyed AFC signal.

Figure 8:
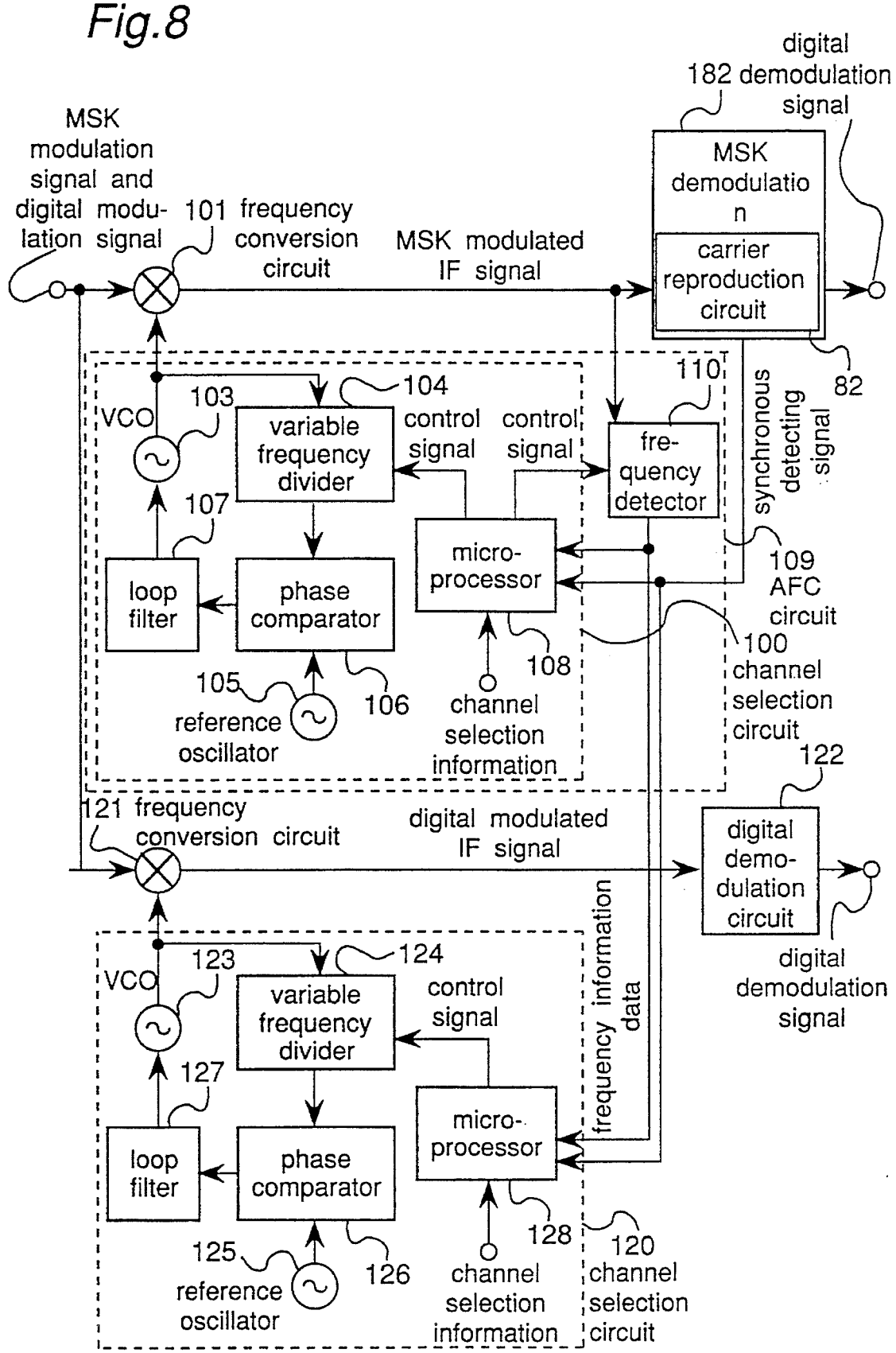
FIG. 8 is a block diagram of a channel selecting apparatus in accordance with a fifth embodiment of the present invention.

FIG. 8 is a channel selecting apparatus in accordance with still a further embodiment of a present invention. A frequency conversion circuit 101 frequency-converts a MSK modulation signals into IF signals. The IF signals are fed to the MSK demodulation circuit 182 and is demodulated so as to output a digital demodulation signal. The MSK demodulation circuit 182 includes a carrier reproduction circuit 82 for reproducing the carrier.

A channel selection circuit 100 includes a VCO 103, a variable frequency divider 104, a reference oscillator 105, a phase comparator 106, a loop filter 107, and a microprocessor 108. As the VCO 103 varies an oscillator frequency by a control signal from the microprocessor 108, an oscillation frequency changes in large increments by channel selecting information inputted to the microprocessor 108 and the local oscillation signal of the VCO 103 is inputted to the frequency conversion circuit 101 and the variable frequency divider 104. The variable frequency divider 104 divides the frequency with a frequency dividing ratio set by the microprocessor 108. The output signal of the variable frequency divider 104 is fed to the phase comparator 106. The phase comparator 106 compares the phase of a local oscillation signal divided in frequency by a variable frequency divider 104 with the phase of the reference oscillator 105 so as to output a phase error signal. The phase error signal is smoothed by a loop filter 107 and is output as a control voltage for controlling the oscillation frequency of the VCO 103.

An AFC circuit 109 is provided for stabilizing the center frequency of an IF signal outputted from the frequency conversion circuit 101 and includes a frequency detector circuit 110 and a channel selector circuit 100. The frequency detector circuit 110 detects the frequency of an MSK-modulated IF signal, and the microprocessor 108 controls the frequency dividing ratio of the variable frequency divider 104 in accordance with the frequency information data obtained by the frequency detector circuit 110, and finely adjusts the oscillation frequency of the VCO 103 and maintains the carrier frequency of the MSK modulated IF signal constant within the given range.

A frequency conversion circuit 121 converts in frequency of the digital modulation signal into an IF signal. The IF signal is fed to the digital demodulation circuit 122 and is demodulated.

A channel selection circuit 120 includes a VCO 123, a variable frequency divider 124, a reference oscillator 125, a phase comparator 126, a loop filter 127, and a microprocessor 128. As the VCO 123 varies an oscillation frequency by a control signal from the microprocessor 128, the oscillation frequency is changed in large increments by channel selecting information inputted to the microprocessor 128 and the local oscillation signal of the VCO 123 is inputted to the frequency conversion circuit 121 and the variable frequency divider 124. The variable frequency divider 124 divides the local oscillation signal by a frequency dividing ratio set by the microprocessor 128. The output signal of the variable frequency divider 124 is fed to the phase comparator 126. The phase comparator 126 compares the phase of the local oscillation signal divided in frequency by the a variable frequency divider 124 with the signal from the reference oscillator 125 so as to output a phase error signal. The phase error signal is smoothed and is output as a control voltage for controlling the oscillation frequency of the VCO 123.

The frequency information data obtained by the frequency detector circuit 110 is fed at the same time to the microprocessor 128 so as to control the frequency dividing ratio of the variable frequency divider 124 included in the channel selecting circuit 120 in accordance with the frequency information data, and the oscillation frequency of the VCO 123 is finely adjusted so as to maintain the carrier frequency of the digitally modulated IF signal constant within the given range.

The operation of the channel selecting apparatus in accordance with the embodiment of FIG. 8 is described hereinafter. When the channel selecting information where a MSK modulation signal exists is inputted to the microprocessor 108, the frequency dividing ratio corresponding to the channel selecting information is set in the variable frequency divider 104 by the microprocessor 108. The VCO 103 feeds to the frequency conversion circuit 101 the local oscillation signal corresponding to the channel selecting information. The frequency conversion circuit 101 converts the MSK modulation signal into an IF signal.

The frequency detector circuit 110 is controlled by the microprocessor 108 so as to detect the frequency of the MSK modulated IF signal. The frequency information data is fed to the microprocessor 108. The microprocessor 108 calculates in accordance with the frequency information data the frequency error between the frequency of the MSK modulated IF signal and the optimum input frequency of the IF signal to be inputted to the MSK demodulation circuit 182 so as to finely adjust the frequency dividing ratio of the variable frequency divider 104 with respect to the frequency error. The frequency of the MSK modulated IF signal is stabilized so that it may stay within the given range around the optimum input frequency of the MSK demodulating circuit 182.

At the same time, the microprocessor 108 compulsorily varies the frequency dividing ratio of the variable frequency divider 104 around the frequency dividing ratio of the variable frequency divider 104 set in accordance with the channel selecting information and the frequency information data obtained by the frequency detector circuit 110 so as to sweep the oscillation frequency of the VCO 103 at a given frequency step size. When the frequency of the IF signal approaches the optimum frequency of the carrier reproduction circuit 82 so as to effect the carrier reproducing operation by the carrier reproduction circuit 82, the synchronizing detection signal is outputted to the microprocessor 108 from the MSK demodulation circuit 182 so as to suspend the variation of the frequency dividing ratio of the variable frequency divider 104.

When the channel selecting information where the digital modulation signal exists is inputted to the microprocessor 128, the frequency dividing ratio corresponding to the channel selecting information is set to the variable frequency divider 124 by the microprocessor 128, and the VCO 123 feeds to the frequency conversion circuit 121 the local oscillation signal corresponding to the set frequency dividing ratio. The frequency conversion circuit 121 converts the digital modulation signal into the IF signal.

When the synchronizing detection signal is outputted from the MSK demodulation circuit 182, the frequency information data of the MSK modulated IF signal obtained by the frequency detector circuit 110 is fed to the microprocessor 128. The microprocessor 128 calculates the frequency error between the frequency of the digitally modulated IF signal and the optimum input frequency of the digital demodulation circuit 122 in accordance with the frequency information data, and finely adjusts the frequency dividing ratio of the variable frequency divider 124 in accordance with the frequency error. The frequency of the IF signal inputted to the digital demodulation circuit 122 is stabilized so that it may stay within the constant range around the optimum input frequency.

The embodiment of the present invention shown in FIG. 8 is a method of normally operating the AFC circuit 109 with respect to the MSK modulation signal for which the AFC circuit can be easily constructed, controlling the oscillation frequency of the VCO 123 by the frequency information data obtained by the AFC circuit 109, and reducing the shift of the frequency of the IF signal from the optimum input frequency of the digital demodulation circuit 122. The frequency of the IF signal to be inputted to the digital demodulation circuit 122 can be easily stabilized so that it may stay within a constant range around the optimum input frequency. Since the frequency of the IF signal already stays within relatively narrower range around the synchronizing pull-in frequency of the digital demodulation circuit 122, both the synchronizing access time of the digital demodulation circuit 122 and the channel tuning time can also be shortened.

Figure 9:
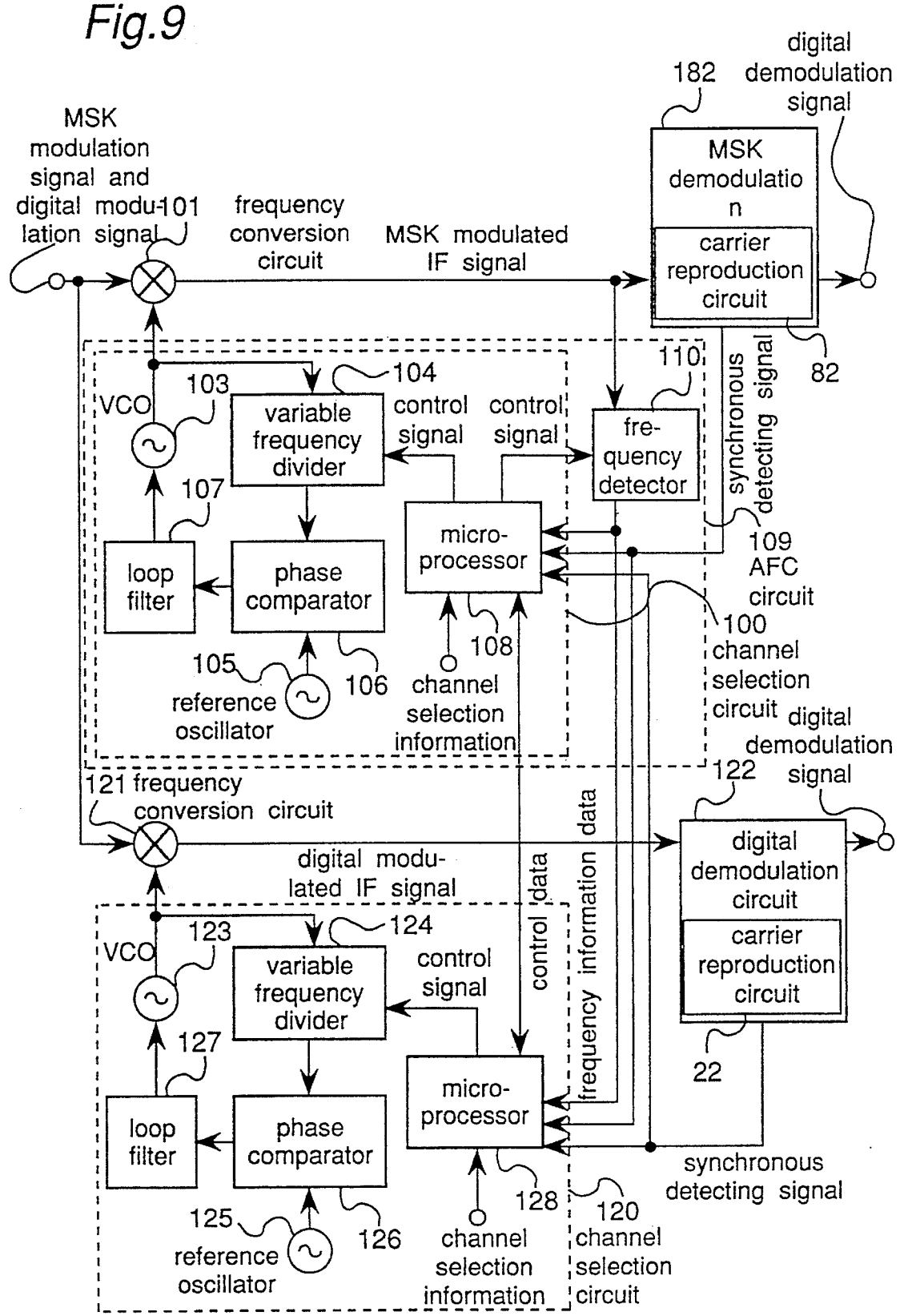
FIG. 9 is a block diagram of a channel selecting apparatus in accordance with a sixth embodiment of the present invention.

FIG. 9 is a channel selecting apparatus in accordance with another important embodiment of the present invention. The frequency conversion circuit 101 converts in frequency the MSK modulation signal into an IF signal. The IF signal is fed to the MSK demodulation circuit 182, and is demodulated and a digital demodulation signal is outputted. The MSK demodulation circuit 182 includes a carrier reproduction circuit 82 for reproducing the carrier. The digital demodulation circuit 122 includes a carrier reproduction circuit 22 for reproducing the carrier. When the carrier reproducing operation is effected by the carrier reproduction circuit 22, the synchronizing detection signal is fed to the microprocessors 108 and 128 from the digital demodulation circuit 122. In the embodiment of FIG. 8, the oscillation frequencies of the VCOs 103 and 123 are controlled in accordance with the frequency information data obtained by the frequency detection circuit 110 and the synchronizing detection signal obtained by the MSK demodulation circuit 182. The embodiment of FIG. 9 is different in that the oscillation frequencies of the VCOs 103 and 123 are controlled by the synchronizing detection signal obtained by the digital demodulation circuit 122 in addition to the frequency information data and the synchronizing detection signal obtained by the MSK demodulation circuit 182.

The operation of the channel selecting apparatus in accordance with the embodiment of FIG. 9 is be described hereinafter. When the channel selecting information where a MSK modulation signal exists is inputted to the microprocessor 108, the frequency dividing ratio corresponding to the channel selecting information is set in the variable frequency divider 104 by the microprocessor 108 and the VCO 103 feeds the local oscillation signal corresponding to the set frequency dividing ratio to the frequency conversion circuit 101. The frequency conversion circuit 101 converts the MSK modulation signal into the IF signal.

The frequency detector circuit 110 is controlled by the microprocessor 108, and detects the carrier frequency of the MSK modulated IF signal, and the frequency information data is fed to the microprocessor 108. The microprocessor 108 calculates the frequency error between the frequency of the MSK modulated IF signal and the optimum input frequency of the IF signal inputted to the MSK demodulation circuit 182 in accordance with the frequency information data so as to finely adjust the frequency dividing ratio of the variable frequency divider 104 in accordance with the frequency error and the frequency of the MSK modulated IF signal is stabilized to stay within a constant range around the optimum input frequency of the MSK demodulation circuit 182.

When the IF signal inputted to the MSK demodulation circuit 122 stays within the constant range around the optimum input frequency, the microprocessor 108 forces the frequency dividing ratio of the variable frequency divider 104 to be varied around the frequency dividing ratio of the variable frequency divider 104 set in accordance with the channel selecting information and the frequency information data obtained by the frequency detector circuit 110 so as to sweep the oscillation frequency of the VCO 123 at a given frequency step size. When the frequency of IF signal approaches the optimum frequency of the carrier reproduction circuit 82 to effect the carrier reproducing operation, the synchronizing detection signal is outputted to the microprocessor 108 from the MSK demodulation circuit 182 so as to suspend the variation of the frequency dividing ratio of the variable frequency divider 104.

When the channel selection information where the digital modulation signal exists is inputted to the microprocessor 128, the frequency dividing ratio in accordance with the channel selecting information and the frequency information data obtained by the frequency detector circuit 110 is set in the variable frequency divider 124 by the microprocessor 128. The VCO 123 feeds to the frequency conversion circuit 121 the local oscillating signal corresponding to the set frequency dividing ratio. The frequency conversion circuit 121 converts the digital converting signal into an IF signal.

When the synchronizing detection signal from the MSK demodulation circuit 182 is outputted, the frequency information data of the MSK modulated IF signal obtained by the frequency detector circuit 110 is fed to the microprocessor 128. The microprocessor 128 calculates in accordance with the frequency information data the frequency error between the carrier frequency of the digitally modulated IF signal and the optimum input frequency of the IF signal inputted to the digital demodulation circuit 122 so as to finely adjust the frequency dividing ratio of the variable frequency divider 124 with respect to the frequency error and the frequency of the IF signal inputted to the digital demodulation circuit 122 is stabilized so that it may stay within the given range around the optimum input frequency.

The frequency of the IF signal inputted to the digital demodulation circuit 122 stays within a constant range around the optimum input frequency and at the same time, the microprocessor 128 compulsorily varies the frequency dividing ratio of the variable frequency divider 124 around the set frequency dividing ratio so as to sweep the oscillation frequency of the VCO 123 at a given frequency step size. When the frequency of the IF signal approaches the optimum frequency of the carrier reproduction circuit 22 to effect the carrier reproducing operation, the synchronizing detection signal is outputted to the microprocessor 128 from the digital demodulation circuit 122 so that the variation of the frequency dividing ratio of the variable frequency divider 124 is suspended.

When the MSK modulation signal does not exist, the first channel selecting information where the digital modulation signal exists is inputted to the microprocessor 128 so as to set the frequency dividing ratio corresponding to the channel selecting information to the variable frequency divider 124 by the microprocessor 128, and the VCO 123 feeds to the frequency conversion circuit 121 the local oscillation signal corresponding to the set frequency dividing ratio. The frequency conversion circuit 121 converts the digital modulating signal into the IF signal. The microprocessor 128 forces the frequency dividing ratio of the variable frequency divider 124 to be varied around the frequency dividing ratio to be set in accordance to the first channel selecting information for sweeping the oscillation frequency of the VCO 123 at a given frequency step size. The variable range of the frequency dividing ratio of the variable frequency divider 124 is set to make up for the frequency variation amount that the digital modulation signal receives through a propagation path. When the frequency of the IF signal approaches the optimum frequency of the carrier reproduction circuit 22 so as to effect the carrier reproducing operation, the synchronizing detection signal is outputted to the microprocessor 128 from the digital demodulation circuit 122 for suspending the variation of the frequency dividing ratio of the variable frequency divider 124.

The microprocessor 108 receives the frequency dividing data of the variable frequency divider 124 from the microprocessor 128 while the synchronizing detection signal is outputted from the digital demodulation circuit 122. On the side of the microprocessor 108, the frequency dividing ratio of the variable frequency divider 124 during the carrier reproducing period, instead of the frequency information data obtained by the frequency detector circuit 110, is preserved while being normally renewed. When the synchronization of the carrier reproduction circuit 22 is lost, the frequency dividing ratio of the variable frequency divider 124 within the channel selector circuit 120 is set in accordance with the newest frequency dividing ratio of the variable frequency divider 124 which is preserved in the microprocessor 108. Next, the microprocessor 128 forces the frequency dividing ratio of the variable frequency divider 124 to vary around the set frequency dividing ratio so as to sweep the oscillation frequency of the VCO 123 at a given frequency step size. Since the carrier frequency of the digitally modulated IF signal is already maintained constant within a given range, the variable range of the frequency dividing ratio of the variable frequency divider 124 is sufficient if it is enough to make up for the carrier frequency variation of the stabilized IF signal. When the frequency of the IF signal approaches the optimum frequency of the carrier reproduction circuit 22 so as to effect the carrier reproduction again, the synchronizing detection signal is outputted to the microprocessor 128 from the digital demodulator circuit 122 for suspending the variation of the frequency dividing ratio of the variable frequency divider 124.

The embodiment of the present invention shown in FIG. 9 is a method of normally operating the AFC circuit 109 with respect to the MSK modulation signal for which the frequency can be easily detected when the MSK modulation signal exists, and controlling the frequency dividing ratio of the channel selection circuit 120 for the digital modulating signal use by the frequency information data obtained by the AFC circuit 109, and reducing the shift of the frequency of the IF signal from the optimum input frequency of the digital demodulation circuit 122. Consequently, the IF signal inputted to the digital demodulation circuit 122 can be easily stabilized so that it may stay within a constant range around the optimum input frequency. Since the frequency of the IF signal stays within relatively narrow constant range around the synchronizing pull-in frequency of the digital demodulation circuit 122, both the synchronizing access time of the digital demodulation circuit 122 and the channel tuning time can also be shortened.

When the MSK modulation signal does not exist, a relatively long time is taken to effect a synchronizing operation immediately after the first channel selecting information where the digital modulation signal exists has been inputted into the microprocessor 128. Once the carrier reproduction is established, the frequency dividing ratio of the variable frequency divider 124 when the carrier reproducing operation of the digital demodulation circuit 122 is effected is fed to the side of the microprocessor 108 from the microprocessor 128 so as to preserve the frequency dividing ratio of the variable frequency divider 124 during the carrier reproduction period while normally being renewed on the side of the microprocessor 108. If the synchronization of the carrier reproduction circuit 22 is lost, the frequency dividing ratio of the variable frequency divider 124 within the channel selection circuit 120 is first set in accordance with the newest frequency dividing ratio of the variable frequency divider 124 which is preserved in the microprocessor 108 during the synchronizing period. Next, the microprocessor 128 forces the frequency dividing ratio of the variable frequency divider 124 to be varied around the set frequency dividing ratio so as to sweep the oscillation frequency of the VCO 123 at a given frequency step size. As the carrier frequency of the digitally modulated IF signal is already maintained constant within the given range, the variable range when the frequency dividing ratio of the variable frequency divider 124 is forced to be varied is sufficient if it is enough to make up for the frequency shift of the IF signal already stabilized from the optimum input frequency of the digital demodulation circuit 122. Both the synchronizing access time and the channel tuning time are shortened.

Figure 10:
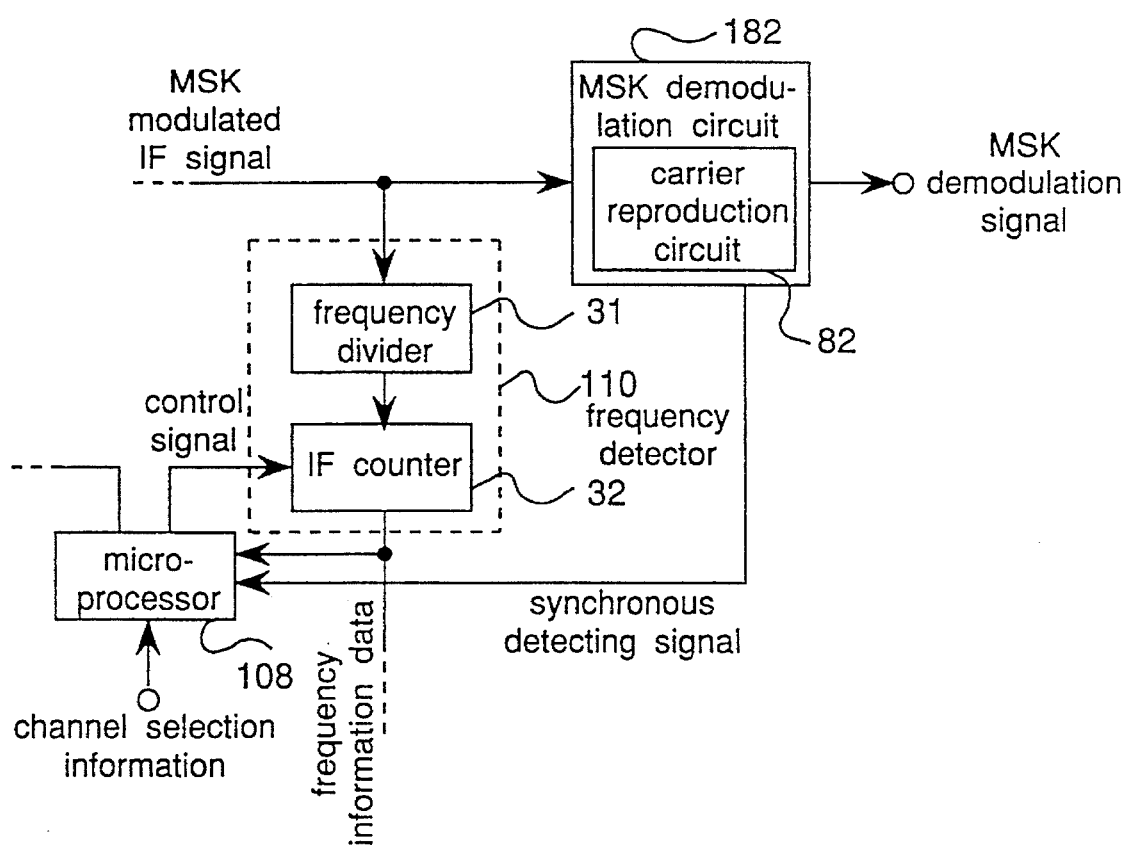
FIG. 10 is a block diagram showing one example of a frequency detecting circuit in accordance with embodiments of FIG. 8 and FIG. 9 of the present invention.

FIG. 10 is a view showing one example of a frequency detector circuit 110 shown in FIG. 8 and FIG. 9. The frequency detector circuit 110 includes a frequency divider 31 and an IF counter 32 as shown in FIG. 10. The frequency divider 31 divides the frequency of the MSK modulated IF signal. The IF counter 32 counts the frequency of the output signal of the frequency divider 31. The microprocessor 108 controls the IF counter 32 so that the frequency of the output signal of the frequency divider 31 is counted for a constant period by the IF counter 32 so as to receive a frequency information data outputted from the IF counter 32. The microprocessor 108 compares a received frequency information data with a reference data set previously within the microprocessor 108. In accordance with the comparison results, the frequency error between the frequency of the MSK modulated IF signal and the optimum input frequency of the MSK demodulation circuit 102 is calculated. The frequency dividing ratio of the variable frequency divider 104 is finely adjusted in accordance with the frequency error and the frequency of the MSK modulated IF signal is stabilized so that it may stay within a constant range around the optimum input frequency.

When the carrier reproducing operation is effected by the MSK demodulation circuit 182, the frequency information data obtained by the IF counter 32 is received at the same time by the microprocessor 128, and is compared with predetermined reference data in the microprocessor 128. In accordance with the comparison results, the frequency error between the frequency of the digitally modulated IF signal and the optimum input frequency of the IF signal inputted to the digital demodulation circuit 122 is calculated. The frequency dividing ratio of the variable frequency divider 124 is finely adjusted in accordance with the frequency error and the frequency of the IF signal inputted to the digital demodulation circuit 122 is stabilized so that it may stay within a constant range around the optimum input frequency.

In the embodiments of FIG. 8, FIG. 9 and FIG. 10, the description is provided where the MSK modulation signal for which the so-called mean value AFC signal is easily obtained from an AFC circuit 109 is inputted. In the channel selecting apparatus of the present invention, a phase-continuous digital modulation signal having a continuous phase where the mean value AFC method is established will do, needless to say, if it is not a MSK modulation signal.

In the embodiments from FIG. 1 through FIG. 10, no description is provided about the relationship between the reference frequency of the reference oscillator 105 and the reference frequency of the reference oscillator 125. Both the reference frequencies may be the same or may be different. The reference oscillator 105 may be the same as the reference oscillator 125.

Although the microprocessor 108 and the microprocessor 128 have been described as being different units in the above-noted description, both the microprocessors may be composed of one microprocessor.

Figure 11:
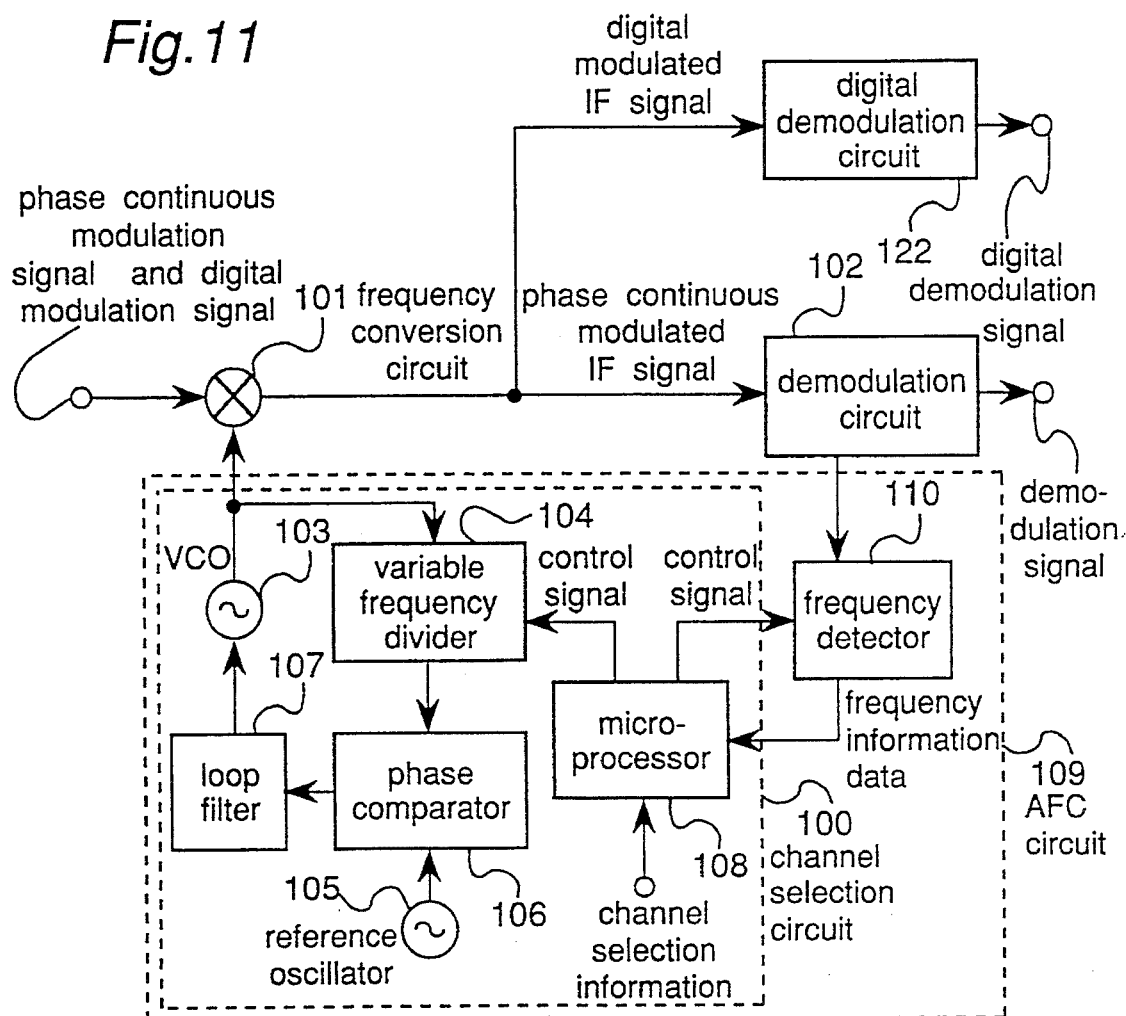
FIG. 11 is a block diagram of a channel selecting apparatus in accordance with a seventh embodiment of the present invention.
Figure 13:
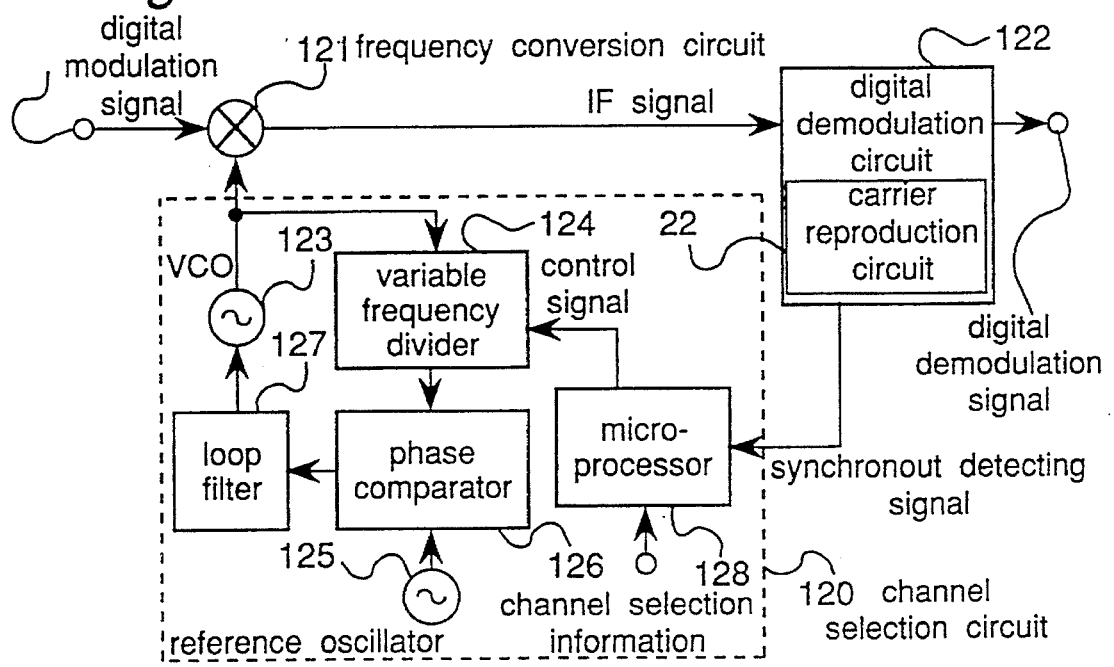
FIG. 13 is a block diagram of a channel selecting apparatus of a digital modulation signal in accordance with a conventional embodiment.

FIG. 11 is a channel selecting apparatus in accordance with a different embodiment of the present invention. A frequency conversion circuit 101 frequency-converts a phase-continuous modulation signal or a digital modulation signal into IF signals. The IF signals are fed to a demodulation circuit 102 and a digital demodulation circuit 122 and are demodulated. A channel selecting circuit 100 includes a VCO 103, a variable frequency divider 104, a reference oscillator 105, a phase comparator 106, a loop filter 107, and a microprocessor 108. As the VCO 103 varies an oscillator frequency by a control signal from a microprocessor 108, an oscillation frequency changes in large increments by the channel selecting information inputted to the microprocessor 108 and the local oscillation signal of the VCO 103 is inputted into the frequency conversion circuit 101 and the variable frequency divider 104. The variable frequency divider 104 divides the frequency by a frequency dividing ratio set by the microprocessor 108. The output signal of the variable frequency divider 104 is fed to the phase comparator 106. The phase comparator 106 compares in phase an output signal of the variable frequency divider 104 and a signal output from the reference oscillator 105 so as to output a phase error signal. The phase error signal is smoothed by the loop filter 107 and is used as a control voltage for controlling the oscillation frequency of the VCO 103.

An AFC circuit 109 is provided for stabilizing the center frequency of an IF signal outputted from the frequency conversion circuit 101 and includes a frequency detector circuit 110 and a channel selection circuit 100. The frequency detecting circuit 110 detects the frequency of a phase-continuous-modulated IF signal, and the microprocessor 108 controls the frequency dividing ratio of the variable frequency divider 104 in accordance with the frequency information data obtained by the frequency detecting circuit 110, and finely adjusts the oscillation frequency of the VCO 103 and maintains the carrier frequency of the phase-continuous-modulated IF signal constant within the given range.

The operation of the channel selecting apparatus in accordance with the embodiment of FIG. 11 is described hereinafter. When the channel selection information where a phase-continuous modulation signal having a continuous phase exists is inputted to a microprocessor 108, the frequency dividing ratio corresponding to the channel selecting information is set in the variable frequency divider 104. The VCO 103 feeds to the frequency conversion circuit 101 the local oscillating signal corresponding to the set frequency dividing ratio. The frequency conversion circuit 101 converts the phase-continuous modulated signal into an IF signal.

The frequency detector circuit 110 is controlled by the microprocessor 108 so as to detect the frequency of the phase-continuous-modulated IF signal. The frequency information data is fed to the microprocessor 108. The microprocessor 108 calculates, in accordance with the frequency information data, the frequency error between the frequency of the phase-continuous-modulated IF signal and the optimum input frequency of the IF signal inputted to the demodulation circuit 102 so as to finely adjust the frequency dividing ratio of the variable frequency divider 104 with respect to the frequency error to stabilize so that the frequency of the IF signal may stay within the given range around the optimum input frequency of the demodulation circuit 102. At this time, the error information about the frequency error between the frequency of the phase-continuous-modulated IF signal and the optimum input frequency of the IF signal inputted to the demodulating circuit 102, together with the channel selecting information, is stored and preserved within the microprocessor 108.

When the channel selecting information where the digital modulating signal exists is inputted to the microprocessor 108, the frequency dividing ratio corresponding to the channel selecting information is fed to the variable frequency divider 104 so that the VCO 103 feeds the local oscillation signal corresponding to the set frequency dividing ratio to the frequency conversion circuit 101. The frequency conversion circuit 101 converts the digital modulated signal into an IF signal.

In accordance with the error information and the channel selecting information stored and preserved within the microprocessor 108, the frequency error between the frequency of the digitally modulated IF signal and the optimum input frequency of the digital demodulation circuit 122 is calculated and the frequency dividing ratio of the variable frequency divider 104 is finely adjusted in accordance with the frequency error, and the frequency of the IF signal inputted to the digital demodulation circuit 122 is stabilized so that it may stay within the given range around the optimum input frequency.

The frequency of the IF signal inputted to the digital demodulation circuit 122 can be stabilized so that it may stay within the given range around the optimum input frequency in accordance with the frequency information data of the phase-continuous-modulated IF signal obtained by the frequency detector circuit 110, because both the phase-continuous modulation signal and the digital modulation signal receive the common frequency drift of the same or the almost the same inclination through a propagation path in the satellite broadcasting operation, and the frequency variation amount that the phase-continuous modulation signal receives through the propagation path is equal to or almost equal to the frequency variation amount that of the digital modulation signal receives through the propagation path, and the frequency difference between the phase-continuous modulation signal and the digital modulation signal inputted into the frequency converting circuit 101 is equal to the frequency difference between the nominal channels. In terrestrial broadcasting, the frequencies of the phase-continuous modulation signal and the digital modulation signal emitted from the transmitters are very stable and almost coincide with the predetermined channel frequency. The frequency drift of the IF signal having a continuous phase is mainly caused by the frequency difference between the set frequency and the nominal frequency of the reference oscillator 105, and by the frequency shift from the nominal frequency of the local oscillator in the frequency conversion circuit not shown except for the frequency conversion circuit 101. The frequency variation amount concerning the VCO 103 is mainly determined by the frequency dividing ratio of the variable frequency divider 104 corresponding to the channel selecting information. Assume that the ratio of the nominal frequency F0 of the reference oscillator 105 to the set frequency F1 of the reference oscillator 105 is F1/F0, and the frequency of the VCO 103 is FV, and the frequency variation amount that the IF signal receives through the frequency conversion circuit 101 becomes FV * F1/F0, so that the ratio of the nominal frequency F0 to the set frequency F1 directly determines the frequency variation amount.

The embodiment of the present invention shown in FIG. 11 is a method of normally operating the AFC circuit 109 with respect to the phase-continuous modulation signal for which the AFC circuit 109 can be easily constructed, calculating the frequency error between the frequency of the IF signal and the optimum input frequency of the IF signal with the frequency information data obtained by the AFC circuit 109, finely adjusting the frequency dividing ratio of the variable frequency divider 104 in accordance with the frequency error, and controlling the oscillation frequency of the VCO 103. It is a method of reducing the frequency shift of the digitally demodulated IF signal from the optimum input frequency by using the error information about the frequency error. The frequency of the IF signal inputted to the digital demodulating circuit 122 can be easily stabilized so that it may stay within a constant range around the optimum input frequency. As the frequency of the IF signal stays within relatively narrow constant range around the synchronizing pull-in frequency of the digital demodulation circuit 122, both the synchronizing access time of the digital demodulation circuit 122 can be also shortened.

Figure 12:
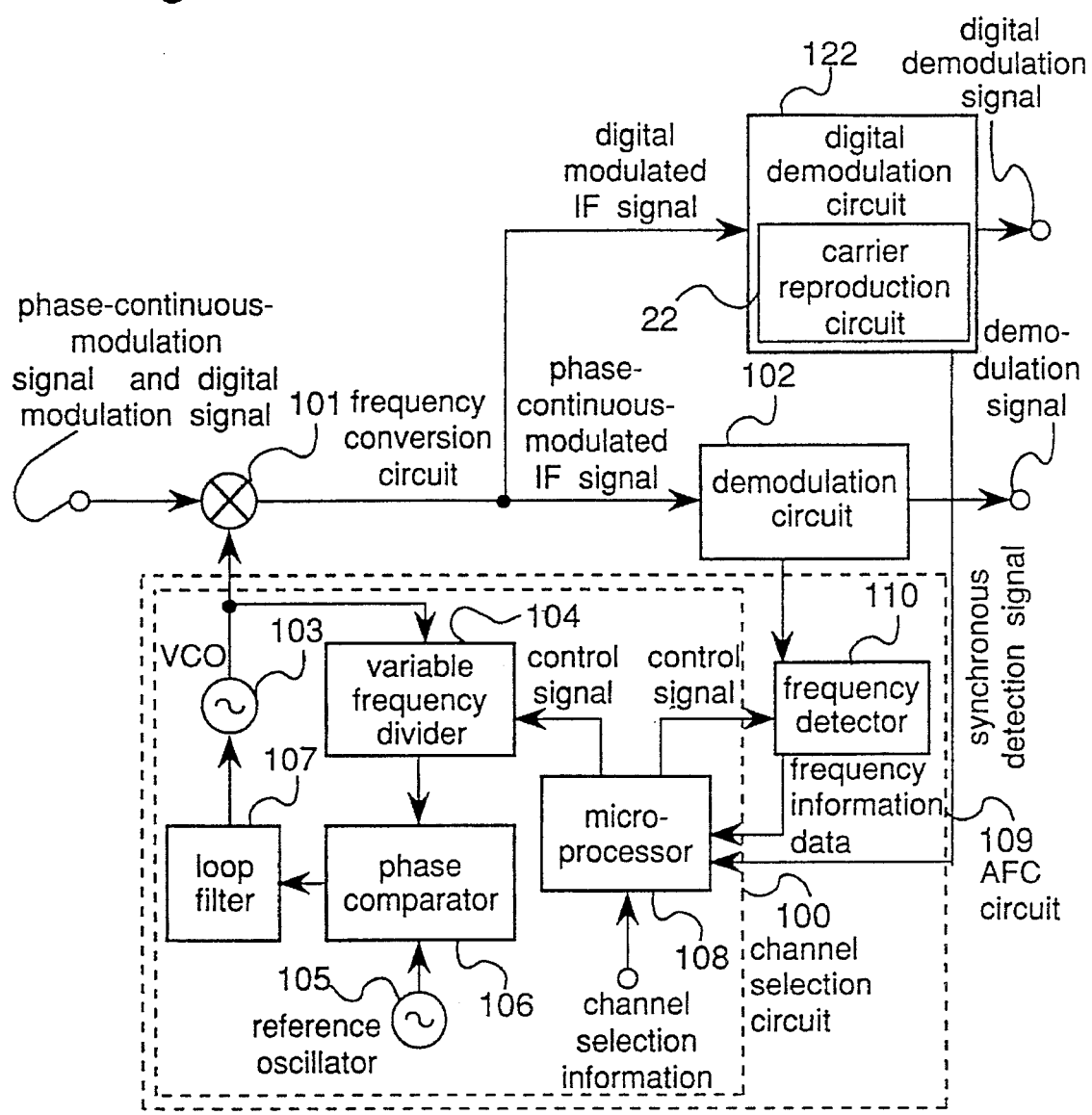
FIG. 12 is a block diagram of a channel selecting apparatus in accordance with an eighth embodiment of the present invention.

FIG. 12 is a channel selecting apparatus in accordance with a different embodiment of the present invention. The digital demodulation circuit 122 includes the carrier reproduction circuit 22 for reproducing the carrier. The carrier reproducing operation is effected by the carrier reproduction circuit 22 and the synchronizing detection signal is fed to the microprocessor 108 from the digital demodulation 122. In the embodiment of FIG. 11, the oscillation frequency of the VCO 103 is controlled in accordance with only the frequency information data obtained by the frequency detector circuit 110. FIG. 12 is different from FIG. 11 in that the oscillation frequency of the VCO 103 is controlled both by the synchronizing detection signal obtained by the digital demodulation circuit 122 and the frequency information data obtained by the frequency detecting circuit 110.

The operation of the channel selecting apparatus in accordance with the embodiment of FIG. 12 is described hereinafter. When the channel selecting information where the phase-continuous modulation signal having a continuous phase exists is inputted to the microprocessor 108, the frequency dividing ratio corresponding to the channel selecting information is set in the variable frequency divider 104 and the VCO 103 feeds the local oscillation signal corresponding to the set frequency dividing ratio to the frequency conversion circuit 101. The frequency conversion circuit 101 converts the phase-continuous modulation signal to an IF signal.

The frequency detector circuit 110 is controlled by the microprocessor 108, and detects the frequency of the phase-continuous-modulated IF signal, and the frequency information data is fed to the microprocessor 108. The microprocessor 108 calculates the frequency error between the frequency of the phase-continuous modulated IF signal and the optimum input frequency of the IF signal inputted to the demodulating circuit 102 in accordance with the frequency information data so as to finely adjust the frequency dividing ratio of the variable frequency divider 104 in accordance with the frequency error and the frequency of the phase-continuous-modulated IF signal is stabilized to stay within a constant range around the optimum input frequency of the demodulation circuit 102. At this time, the frequency error between the frequency of the phase-continuous-modulated IF signal and the optimum input frequency inputted to the demodulation circuit 102, together with the channel selecting information, is stored and preserved within the microprocessor 108.

When the channel selecting information where the digital modulating signal exists is inputted to the microprocessor 108, the frequency dividing ratio corresponding to the channel selecting information is fed to the variable frequency divider 104 so that the VCO 103 feeds the local oscillation signal corresponding to the set frequency dividing ratio to the frequency conversion circuit 101. The frequency conversion circuit 101 converts the digital modulating signal into an IF signal. In accordance with the frequency error information and the channel selecting information stored and preserved within the microprocessor 108, the frequency error between the frequency of the digitally modulated IF signal and the optimum input frequency of the digital demodulation circuit 122 is calculated and the frequency dividing ratio of the variable frequency divider 104 is finely adjusted in accordance with the frequency error, and the frequency of the IF signal to be inputted to the digital demodulation circuit 122 is stabilized so that it may stay within the given range around the optimum input frequency.

When the frequency of the IF signal inputted to the digital demodulation circuit 122 stays within a constant range around the optimum input frequency and the synchronizing detection signal is not outputted, the microprocessor 108 compulsorily varies the frequency dividing ratio of the variable frequency divider 104 around the frequency dividing ratio set after finishing the fine adjustment so as to sweep the oscillation frequency of the VCO 103 at a given frequency step size. When the frequency of the IF signal approaches the optimum frequency of the carrier reproduction circuit 22 to effect the carrier reproducing operation, the synchronizing detection signal is outputted to the microprocessor 108 from the digital demodulation circuit 122 so that the variation of the frequency dividing ratio of the variable frequency divider 104 is suspended.

In the microprocessor 108, the frequency dividing ratio of the variable frequency divider 104, instead of the frequency information data obtained by the frequency detector circuit 110, is preserved, being normally renewed while the synchronizing detecting signal from the digital demodulation circuit 122 is being outputted. When the synchronization of the carrier reproduction circuit 22 is lost by the inputting operation of the different channel selecting information, or the like, the frequency dividing ratio of the variable frequency divider 104 is set in accordance with the newest frequency dividing ratio of the variable frequency divider 104 preserved within the microprocessor 108. When the frequency of the IF signal inputted to the digital demodulation circuit 122 stays within the constant range around the optimum input frequency, and the synchronizing detection signal is not outputted, the microprocessor 108 compulsorily varies the frequency dividing ratio of the variable frequency divider 104 around the set frequency dividing ratio so as to sweep the oscillation frequency of the VCO 103 at a given frequency step size. As the carrier frequency of the digitally modulated IF signal is already maintained constant within the given range, the variable range of the frequency dividing ratio of the variable frequency divider 104 is sufficient if it is enough to make up for the frequency variation amount of the stabilized IF signal. The frequency of the IF signal approaches the optimum frequency of the carrier reproduction circuit 22 so as to effect the carrier reproducing operation again, the synchronizing detection signal is outputted to the microprocessor 108 from the digital demodulation circuit 122 for suspending the variation of the frequency dividing ratio of the variable frequency divider 104. A series of operations of obtaining such synchronization is repeated each time the synchronization is lost.

When the phase-continuous modulation signal does not exist, the first channel selecting information where the digital modulation signal exists is inputted to the microprocessor 108 so as to set the frequency dividing ratio corresponding to the channel selecting information to the variable frequency divider 104, and the VCO 103 feeds to the frequency conversion circuit 101 the local oscillation signal corresponding to the set frequency dividing ratio. The frequency conversion circuit 101 converts the digital modulating signal into the IF signal. The microprocessor 108 forces the frequency dividing ratio of the variable frequency divider 104 to be varied around the frequency dividing ratio to be set in accordance with the first channel selecting information for sweeping the oscillation frequency of the VCO 103 at a given frequency step size.

The variable range of the frequency dividing ratio of the variable frequency divider 104 is set so that the frequency of the digital modulated IF signal may be changed sufficiently over the frequency variation amount that the digital modulation signal receives through a propagation path. When the frequency of the IF signal approaches the optimum frequency of the carrier reproduction circuit 22 so as to effect the carrier reproducing operation, the synchronizing detection signal is outputted to the microprocessor 108 from the digital demodulation circuit 122 for suspending the variation of the frequency dividing ratio of the variable frequency divider 104.

In the microprocessor 108, the frequency dividing ratio of the variable frequency divider 104, instead of the frequency information data obtained by the frequency detector circuit 110, is preserved, being normally renewed while the synchronizing detecting signal from the digital demodulation circuit 122 is being outputted. When the synchronization of the carrier reproduction circuit 22 is lost by the inputting operation of the different channel selecting information or the like, the frequency dividing ratio of the variable frequency divider 104 is set in accordance with the newest frequency dividing ratio of the variable frequency divider 104 preserved within the microprocessor 108. When the frequency of the IF signal to be inputted into the digital demodulation circuit 122 stays within the constant range around the optimum input frequency, and the synchronizing detection signal is not outputted, the microprocessor 108 compulsorily varies the frequency dividing ratio of the variable frequency divider 104 around the set frequency dividing ratio so as to sweep the oscillation frequency of the VCO 103 at a given frequency step size. As the carrier frequency of the digitally modulated IF signal is already maintained constantly within a given range and is stabilized, the variable range of the frequency dividing ratio of the variable frequency divider 104 is sufficient if it is enough to make up for the frequency variation amount of the stabilized IF signal. The frequency of the IF signal approaches the optimum frequency of the carrier reproducing circuit 22 so as to effect the carrier reproducing operation again, the synchronizing detection signal is outputted to the microprocessor 108 from the digital demodulation circuit 122 for suspending the variation of the frequency dividing ratio of the variable frequency divider 104. A series of operations of obtaining such synchronization is repeated each time the synchronization is lost.

The embodiment of the present invention shown FIG. 12 is a method of operating the AFC circuit 109 with respect to the phase-continuous modulation signal for which the frequency can be easily detected when the phase-continuous modulation signal exists, calculating the frequency error between the frequency of the IF signal and the optimum input frequency of the IF signal by using the frequency information data obtained by the AFC circuit 109, finely adjusting the frequency dividing ratio of the variable frequency divider 104 in accordance with the frequency error, and controlling the oscillation frequency of the VCO 103. It is a method of reducing the frequency shift from the optimum input frequency of the digital demodulation circuit 122 of the digitally demodulated IF signal by the frequency error. The IF signal inputted to the digital demodulation circuit 122 can be easily stabilized so that it may stay within a constant range around the optimum input frequency. As the frequency of the IF signal stays within a relatively narrow constant range around the synchronizing pull-in frequency of the digital demodulation circuit 122, the synchronizing access time of the digital demodulation circuit 122 is shortened.

When the phase-continuous modulation signal does not exist, relatively long time is taken to acquire a synchronizing operation immediately after the first channel selecting information where the digital modulation signal exists has been inputted into the microprocessor 108. Once the carrier reproduction is established, the frequency dividing ratio of the variable frequency divider 104 is preserved and normally renewed while the synchronizing detection signal from the digital demodulation circuit 122 is outputted to the microprocessor 108. If the synchronization of the carrier reproduction circuit 22 is lost by the inputting operation of the different channel selecting information or the like, the frequency dividing ratio of the variable frequency divider 104 is set in accordance with the newest frequency dividing ratio of the variable frequency divider 104 which is preserved within the microprocessor 108 during the synchronizing period. The microprocessor 108 forces the frequency dividing ratio of the variable frequency divider 104 around the set frequency dividing ratio so as to sweep the oscillation frequency of the VCO 123 at a given frequency step size. As the carrier frequency of the digitally modulated IF signal is already maintained constant within the given range, the variable range when the frequency dividing ratio of the variable frequency divider 104 is sufficient if it is enough to make up for the frequency shift of the IF signal already stabilized. Therefore synchronizing access time is shortened.

In the embodiments of FIG. 11 and FIG. 12, the IF signal which is the output signal of the frequency conversion circuit 101 is inputted directly to the demodulation circuit 102 and the digital demodulation circuit 122. A different frequency conversion circuit may be provided between the frequency conversion circuit 101 and one of the demodulating circuits 102 and the digital demodulation circuit 122 or a different frequency conversion circuit may be interposed between a frequency converting circuit 101 and both the a demodulating circuit 102 and the digital demodulation circuit 122.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. A channel selecting apparatus comprising both a channel selecting circuit for use with a phase-continuous modulation signal, which includes a first frequency converter for frequency-converting a phase-continuous modulation signal having a continuous phase so as to output a first intermediate frequency signal, a first channel selector provided with a first voltage controlled oscillator for changing the oscillation frequency in accordance with channel selecting information, and for feeding to the first frequency converter the local oscillation signal of the first voltage controlled oscillator, a frequency information detector for detecting the frequency information of the first intermediate frequency signal, a first frequency controller for receiving the frequency information obtained by the frequency information detector, and for finely adjusting the oscillation frequency of the first voltage controlled oscillator so that the frequency of the first intermediate frequency signal stays within a given frequency range, and a channel selecting circuit for use with a digital modulation signal, which includes a second frequency converter for frequency-converting the digital modulation signal so as to output a second intermediate frequency signal, a second channel selector provided with a second voltage controlled oscillator for changing the oscillation frequency by channel selecting information and for feeding to the second frequency converter the local oscillation signal of the second voltage controlled oscillator, a second frequency controller for receiving the frequency information obtained by the frequency information detector of the channel selecting circuit for use with a phase-continuous modulation signal, and for finely adjusting the oscillation frequency of the second voltage controlled oscillator so that the frequency of the second intermediate frequency signal stays within the given frequency range; wherein said two channel selecting circuits are disposed so as to be capable of simultaneous operation.

2. A channel selecting apparatus as defined in claim 1, where the phase-continuous modulation signal having a continuous phase is an FM modulation signal.

3. A channel selecting apparatus as defined in claim 2, wherein the frequency information detector for detecting the frequency information of the first intermediate frequency signal includes a counter for counting the frequency of the first intermediate frequency signal, and wherein the first frequency controller calculates error data between output data of the counter and reference data previously set so as to finely adjust the oscillation frequency of the first voltage controlled oscillator so that the error data stays within given range.

4. A channel selecting apparatus as defined in claim 2, wherein the frequency information detector for detecting the frequency information of the first intermediate frequency signal includes a PLL-type demodulator for detecting a center frequency of the first intermediate frequency signal from a direct current component of an FM demodulation signal which is an output signal of the PLL-type demodulator, and wherein the first frequency controller includes a calculator for calculating an error voltage between a direct current component of the FM demodulation signal and a reference voltage which has been previously set so as to finely adjust the oscillation frequency of the first voltage controlled oscillator so that the error voltage stays within a given range.

5. A channel selecting apparatus as defined in claim 2, further comprising a C/N (carrier-to-noise) ratio detector for detecting the C/N ratio of the FM modulation signal, wherein the frequency information detector for detecting the frequency information of the first intermediate frequency signal includes a counter for counting the frequency of the first intermediate frequency signal, and wherein the first frequency controller includes a setter for setting in accordance with the C/N ratio obtained by the C/N ratio detector the reference data to be compared with the output data of the counter so as to finely adjust the oscillation frequency of the first voltage controlled oscillator so that the error data between the output data of the counter and the reference data stays within the given range.

6. A channel selecting apparatus as defined in claim 2, further comprising a carrier reproducer for reproducing the carrier of the second intermediate frequency signal so as to output a synchronizing detection signal, wherein the second frequency controller receiving the frequency information obtained by the frequency information detector, when the FM modulation signal is inputted into the first frequency converter, finely adjusts the oscillation frequency of the second voltage controlled oscillator so that the frequency of the second intermediate frequency signal stays within the given frequency range, and, when the FM modulation signal fails to be inputted to the first frequency converter, finely adjusts the oscillation frequency of the second voltage controlled oscillator before the synchronizing detection signal is outputted so that the frequency of the second intermediate frequency signal stays within a given range.

7. A channel selecting apparatus as defined in claim 6, where the frequency information detector for detecting the frequency information of the first intermediate frequency signal is a counter for counting the frequency of the first intermediate frequency signal, and wherein the first frequency controller includes a calculator for calculating error data between the output data of the counter and reference data which has been previously set so as to finely adjust the oscillation frequency of the first voltage controlled oscillator so that the error data stays within the given range.

8. A channel selecting apparatus as defined in claim 6, where the frequency information detector for detecting the frequency information of the first intermediate frequency signal is a PLL-type demodulator for detecting a center frequency of the first intermediate frequency signal from a direct current component of an FM demodulation signal which is an output signal of the PLL-type demodulator, and wherein the first frequency controller includes a calculator for calculating error voltage between a direct current component of the FM demodulation signal and a reference voltage which has been previously set so as to finely adjust the oscillation frequency of the first voltage controlled oscillator so that the error voltage stays within the given range.

9. A channel selecting apparatus as defined in claim 6, further comprising a C/N (carrier to noise) ratio detector for detecting the C/N ratio of the FM modulation signal, wherein the frequency information detector for detecting the frequency information of the first intermediate frequency signal includes a counter means for counting the frequency of the first intermediate frequency signal, and wherein the first frequency controller includes a setter for setting reference data in accordance with the C/N ratio obtained by the C/N ratio detector, the reference data to be compared with the output data of the counter so as to finely adjust the oscillation frequency of the first voltage control oscillator so that the error data between the output data of the counter and the reference data stays within the given range.

10. A channel selecting apparatus as defined in claim 1, wherein the phase-continuous modulation signal having a continuous phase is a phase-continuous digital modulation signal having a continuous phase.

11. A channel selecting apparatus as defined in claim 10, wherein the frequency information detector for detecting the frequency information of the first intermediate frequency signal includes a counter for counting the frequency of the first intermediate frequency signal, and wherein the first frequency controller includes a calculator for calculating error data between the output data of the counter and reference data which has been previously set so as to finely adjust the oscillation frequency of the first voltage controlled oscillator so that the error data stays within a given range.

12. A channel selecting apparatus as defined in claim 10, further comprising a carrier reproducer for reproducing the carrier of the second intermediate frequency signal so as to output a synchronizing detection signal, wherein the second frequency controller for receiving the frequency information obtained by the frequency information detector, when the phase-continuous digital modulation signal is inputted into the first frequency converter, finely adjusts the oscillation frequency of the second voltage controlled oscillator so that the frequency of the second intermediate frequency signal stays within the given frequency range, and, when the phase-continuous digital modulation signal fails to be inputted to the first frequency converting circuit, finely adjusts the oscillation frequency of the second voltage controlled oscillator before the synchronizing detection signal is outputted so that the frequency of the second intermediate frequency signal stays within a given range.

13. A channel selecting apparatus as defined in claim 12, wherein the frequency information detector for detecting the frequency information of the first intermediate frequency signal includes a counter for counting the frequency of the first intermediate frequency signal, wherein the first frequency controller includes a calculator for calculating error data between the output data of the counter and reference data which has been previously set so as to finely adjust the oscillation frequency of the first voltage controlled oscillator so that the error data stays within the given range.

14. A channel selecting apparatus as defined in claim 12, wherein the phase-continuous digital modulation signal is an MSK modulation signal.

15. A channel selecting apparatus as defined in claim 14, wherein the frequency information detector for detecting the frequency information of the first intermediate frequency signal includes a counter for counting the frequency of the first intermediate frequency signal, wherein the first frequency controller includes a calculator for calculating error data between the output data of the counter and reference data which has been previously set so as to finely adjust the oscillation frequency of the first voltage controlled oscillator so that the error data stays within the given range.

16. A channel selecting apparatus as defined in claim 14, further comprising a carrier reproducer for reproducing the carrier of the second intermediate frequency signal so as to output the synchronizing detection signal, wherein the second frequency controller for receiving the frequency information obtained by the frequency information detector, when the MSK modulation signal is inputted to the first frequency converter, finely adjusts the oscillation frequency of the second voltage controlled oscillator so that the frequency of the second intermediate frequency signal stays within the given frequency range, and, when the MSK modulation signal fails to be inputted to the first frequency converter, finely adjusts the oscillation frequency of the second voltage controlled oscillator before the synchronizing detection signal is outputted so that the frequency of the second intermediate frequency signal stays within the given range.

17. A channel selecting apparatus as defined in claim 16, wherein the frequency information detector for detecting the frequency information of the first intermediate frequency signal includes a counter for counting the frequency of the first intermediate frequency signal, and wherein the first frequency controller includes a calculator for calculating error data between the output data of the counter and the previously set reference data so as to finely adjust the oscillation frequency of the first voltage controlled oscillator so that the error data stays within the given range.

18. A channel selecting apparatus as defined in claim 1, where the phase-continuous modulation signal having a continuous phase is an AM modulation signal.

19. A channel selecting apparatus comprising a frequency converter for frequency-converting a phase-continuous modulation signal having a continuous phase or a digital modulation signal so as to respectively output a first intermediate frequency signal or a second intermediate frequency signal, a channel selector including a voltage controlled oscillator for changing the oscillation frequency in accordance with the channel selecting information so as to feed the local oscillation signal of the voltage controlled oscillator to the frequency converter, a frequency information detector for detecting the frequency information of the first intermediate frequency signal, a frequency information memory for storing the frequency information obtained by the frequency information detector, and a frequency controller, for receiving the frequency information obtained by the frequency information detector, when the phase-continuous modulation signal having a continuous phase is frequency-converted by the frequency converter, and when the first intermediate frequency signal is outputted, finely adjusting the oscillation frequency of the voltage controlled oscillator so that the frequency of the first intermediate frequency signal stays within a given frequency range, and for receiving the frequency information stored by the frequency information memory, when the digital modulation signal is frequency-converted by the frequency converter, and when the second intermediate frequency signal is outputted, to finely adjusting the oscillation frequency of the voltage controlled oscillator so that the frequency of the second intermediate frequency signal stays within the given frequency range.

20. A channel selecting apparatus as defined in claim 19, further comprising a carrier reproducer for reproducing a carrier of the second intermediate frequency signal so as to output a synchronizing detection signal when the carrier has been reproduced, an oscillation frequency information memory for storing the oscillation frequency information of the voltage controlled oscillator when the synchronizing detection signal is outputted, another frequency controller for receiving the frequency information obtained by the frequency information detector, when the phase-continuous modulation signal having a continuous phase is frequency-converted by the frequency converter, and when the first intermediate frequency signal is outputted, finely adjusting the oscillation frequency of the voltage controlled oscillator so that the frequency of the first intermediate frequency signal stays within the given frequency range and for receiving the frequency information stored by the frequency information memory, when the digital modulation signal is frequency-converted by the frequency converter, and when the second intermediate frequency signal is outputted, finely/adjusting the oscillation frequency of the voltage controlled oscillator so that the frequency of the second intermediate frequency signal stays within the given frequency range and thereafter outputting the synchronizing detection signal, still another frequency controller for finely adjusting the oscillation frequency of the voltage controlled oscillator before the synchronizing detection signal is outputted, when the phase-continuous modulation signal having a continuous phase fails to exist, the first intermediate frequency signal is prevented from being outputted, and the frequency information fails to be obtained by the frequency information detector, for receiving the oscillation frequency information of the voltage controlled oscillator stored by the oscillation frequency information memory, after the synchronizing detection signal has been outputted, so as to finely adjust the oscillation frequency of the voltage control oscillator so that the frequency of the second intermediate frequency signal stays within in the given frequency range and thereafter the synchronizing detecting signal is outputted.

* * * * *